(12) United States Patent
Ooga

(10) Patent No.: US 8,471,546 B2
(45) Date of Patent: Jun. 25, 2013

(54) TIME CONSTANT CIRCUIT, SWITCH CIRCUIT, DC/DC CONVERTER, AND DISPLAY DEVICE

(75) Inventor: Kouichi Ooga, Kanagawa (JP)

(73) Assignee: NLT Technologies, Ltd., Kanagawa (JP)

( * ) Notice: Subject to any disclaimer, the term of this patent is extended or adjusted under 35 U.S.C. 154(b) by 347 days.

(21) Appl. No.: 12/891,434

(22) Filed: Sep. 27, 2010

(65) Prior Publication Data

US 2011/0074377 A1    Mar. 31, 2011

(30) Foreign Application Priority Data

Sep. 28, 2009   (JP) .................................. 2009-222519

(51) Int. Cl.
*G05F 5/08*   (2006.01)
(52) U.S. Cl.
USPC ............................. 323/303; 323/226; 323/908
(58) Field of Classification Search
USPC .......... 323/220, 226, 299, 303, 908; 361/93.9
See application file for complete search history.

(56) References Cited

U.S. PATENT DOCUMENTS

| 4,489,270 A | * | 12/1984 | Diller | 323/354 |
| 4,992,719 A | * | 2/1991 | Harvey | 363/59 |
| 5,111,058 A | * | 5/1992 | Martin | 307/66 |

FOREIGN PATENT DOCUMENTS

| JP | 2003-111460 A | 4/2003 |
| JP | 2005-223804 A | 8/2005 |

* cited by examiner

*Primary Examiner* — Gary L Laxton
(74) *Attorney, Agent, or Firm* — Sughrue Mion, PLLC

(57) ABSTRACT

To provide a time constant circuit and the like capable of acquiring a characteristic of an output voltage that attenuates gradually after attenuating steeply, compared to a characteristic that attenuates monotonously. The time constant circuit includes: a series/parallel circuit formed by serially connecting a plurality of parallel circuits each formed with a resistance element and a capacitance element between a first terminal and a second terminal; and a voltage-dividing resistance element connected between a third terminal connected to the second terminal and a fourth terminal. A first parallel circuit is formed with a first resistance element and a first capacitance element, a second parallel circuit with a second resistance element and a second capacitance element, and an n-th parallel circuit with an n-th resistance element and an n-th capacitance element. Note that "n" is the number of the parallel circuits and it is an integer of 2 or larger.

6 Claims, 12 Drawing Sheets

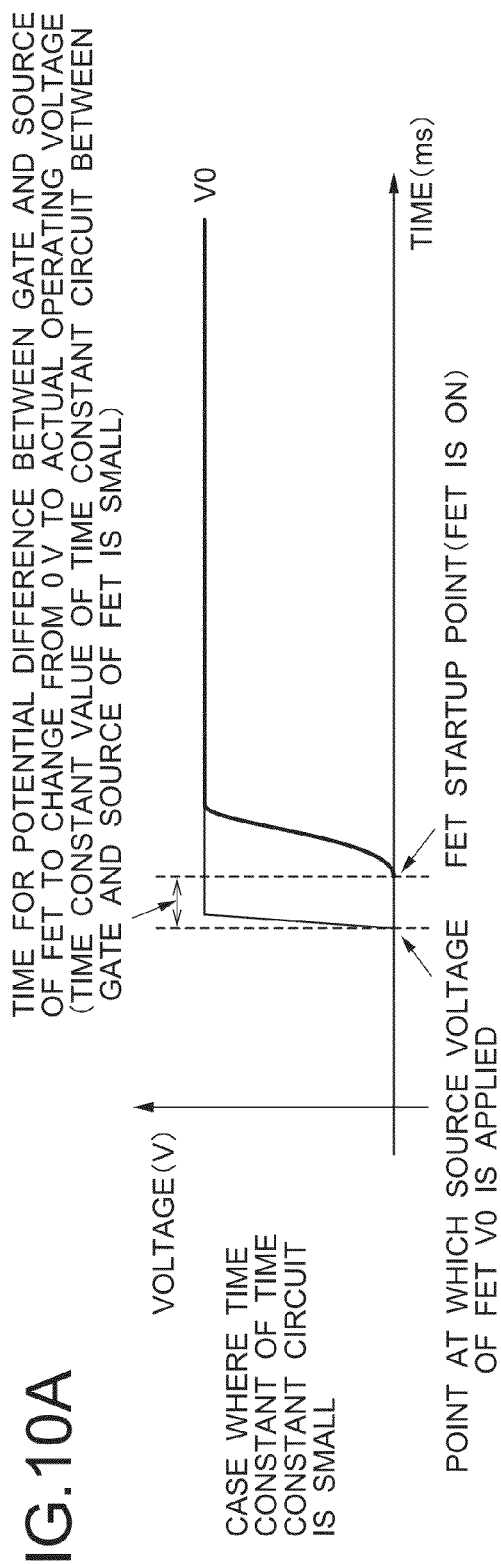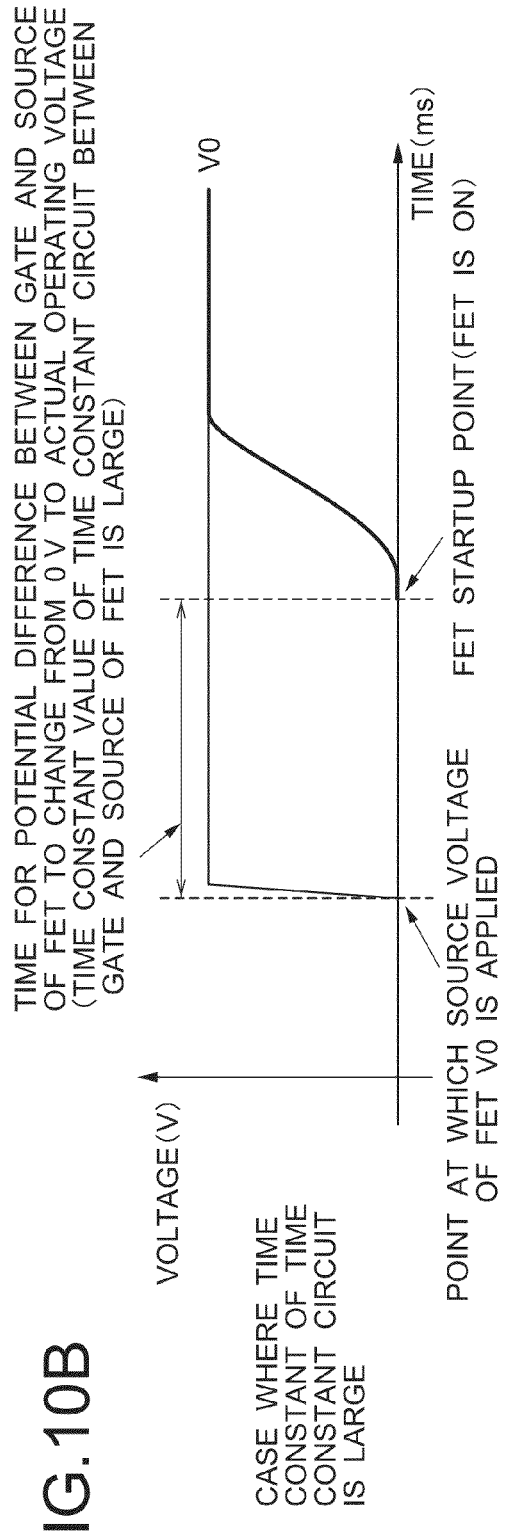

TIME CONSTANT CIRCUIT, SWITCH CIRCUIT, DC/DC CONVERTER, AND DISPLAY DEVICE

CROSS-REFERENCE TO RELATED APPLICATION

This application is based upon and claims the benefit of priority from Japanese patent application No. 2009-222519, filed on Sep. 28, 2009, the disclosure of which is incorporated herein in its entirety by reference.

BACKGROUND OF THE INVENTION

1. Field of the Invention

The present invention relates to a time constant circuit that outputs voltages attenuating as the time passes, and a switch circuit and the like provided with the same.

2. Description of the Related Art

Recently, due to implementation of higher-resolution and larger-scaled panels of display devices, the power consumption within the display devices tend to increase accordingly. In order to stably supply a supply voltage steadily and to stably supply the supply voltage in response to a transient current, it is essential to provide a capacitor for accumulating electric charges and discharging the charges as necessary.

In the meantime, when the capacity of the capacitor is increased to acquire a stable supply voltage, a large rush current is generated at the time of starting up the power supply. This issue becomes more prominent when the resolution and the size of the display devices are increased further.

Japanese Unexamined Patent Publication 2003-111460 (FIG. 1: Patent Document 1) discloses a time constant circuit that controls such rush current. The time constant circuit is structured by disposing a single capacitor and a single resistor in parallel between a gate and a source of an FET (Field Effect Transistor), and disposing a resistor between a gate and a ground (GND) of the FET (see FIG. 8). Through moderating a change in a gate potential of the FET at the time of starting up the FET by the time constant circuit, the rush current is decreased. Between the gate and GND of the FET, a voltage-dividing resistor for determining the gate potential of the FET is disposed.

Further, Japanese Unexamined Patent Publication 2005-223804 (FIG. 4: Patent Document 2) discloses a voltage control circuit that controls the voltage between the gate and the source of the FET. This voltage control circuit uses an operation amplifier, a resistor, and a capacitor for decreasing the rush current. The voltage between the gate and the source of the FET is controlled by the voltage control circuit to decrease the rush current at the time of starting up the FET.

Various kinds of ICs such as a driver IC (Integrated Circuit) for driving the display device and a timing controller require a power source that outputs different voltage values. However, it is desired for the voltage inputted from an external power source to be a single kind of voltage value because it is easy to use. Thus, a power source circuit (DC (Direct Current)/DC converter) that generates a plurality of voltage values from the one kind of voltage value is used. For the output timings of each voltage generated by the DC/DC converter, it is necessary to set the starting order (power source sequence) for avoiding breakdowns and malfunctions of the various kinds of ICs. The starting order is controlled normally by using a component or a device having a switch function such as an FET.

In a case where there is a smoothing capacitor on the output side of the FET when the FET is started up (FET is ON), a large current (rush current) transitionally flows immediately after the FET is turned ON due to a steep charging operation done to the capacitor. When this rush current is too large, the FET may be damaged and the protecting function of the input power source line may malfunction. Even if it does not lead to the malfunctions of the protecting function of the input power source line, an unexpected decrease in the voltage (voltage drop) of the input voltage may occur, and the protecting function of the DC/DC converter may malfunction due to the voltage drop.

In order to reduce the rush current, a change in the voltage between the gate and the source of the FET after the voltage is applied to the FET may be controlled so that the FET starts up gradually. For example, as disclosed in Patent Document 2, a voltage control circuit may be provided between the gate and the source of the FET.

However, in order to properly control the voltage between the gate and the source of the FET by using the voltage control circuit, there is such a shortcoming that the circuit scale is increased. That is, with the structure of Patent Document 2, one operation amplifier, one transistor, one capacitor, and seven resistors are required, so that the circuit scale becomes extremely large. When the circuit scale is increased, the area of the substrate on which the circuit is loaded becomes large. Therefore, the cost as a whole is increased.

Thus, in order to decrease the rush current with a simple structure (only with a passive element), the FET is gradually started up in many cases by providing a time constant circuit that is formed with one resistor and one capacitor between the gate and the source of the FET as disclosed in Patent Document 1 (see FIG. 8).

However, it is necessary to set the value of the time constant determined according to the resistance value of the resistor and the capacitance value of the capacitor to a large value for sufficiently reducing the rush current. When the time constant is increased, however, the time from the point at which the voltage of the FET is applied to the point at which the actually the FET starts up becomes extended. That is, there is such a new issue generated that the start point of the output voltage of the DC/DC converter is delayed. This means that the start timing of the power source that supplies the voltages to the various kinds of ICs is delayed in the display device that is provided with the DC/DC converter. As a result, the time until the various kinds of ICs are driven becomes extended, so that the time from the point at which the power is turned on to the point at which a video is displayed becomes longer.

As described, when the starting timing of the FET is moderated by the time constant circuit to reduce the rush current as much as possible without increasing the circuit scale, the rush current can be decreased. However, there is generated another issue that the starting timing becomes delayed. When the starting timing is delayed, the time until an image displayed becomes longer in the display device.

This is due to the time constant of the time constant circuit. That is, for securely decreasing the rush current, it is necessary to attenuate the gate voltage gradually by increasing the time constant. As a result, the starting timing of the FET is delayed. Inversely, for making the starting timing of the FET faster, it is necessary to attenuate the gate voltage steeply by making the time constant small. As a result, the rush current cannot be decreased sufficiently.

It is therefore an exemplary object of the present invention to provide a time constant circuit and the like, which can acquire the characteristic of the output voltage that gradually attenuates after attenuating steeply, compared to the characteristic of the output voltage that only attenuates monotonously.

SUMMARY OF THE INVENTION

The time constant circuit according to an exemplary aspect of the invention is characterized to include: a serial-parallel circuit that is formed by serially connecting a plurality of parallel circuits each structured with a resistance element and a capacitance element between a first terminal and a second terminal; and a voltage-dividing resistance element connected between a third terminal that is connected to the second terminal and a fourth terminal, wherein the first terminal and the second terminal are input terminals, and the third terminal and the fourth terminal are output terminals.

BRIEF DESCRIPTION OF THE DRAWINGS

FIGS. 10A and 10B are graphs showing an example of delay in the output voltage start point of a DC/DC converter according to the comparative example, in which FIG. 10A corresponds to a case where C100=0.01 µF of FIG. 9 and FIG. 10B corresponds to a case where C100=0.1 µF of FIG. 9;

DETAILED DESCRIPTION OF THE EXEMPLARY EMBODIMENTS

First Exemplary Embodiment

Figure 1:
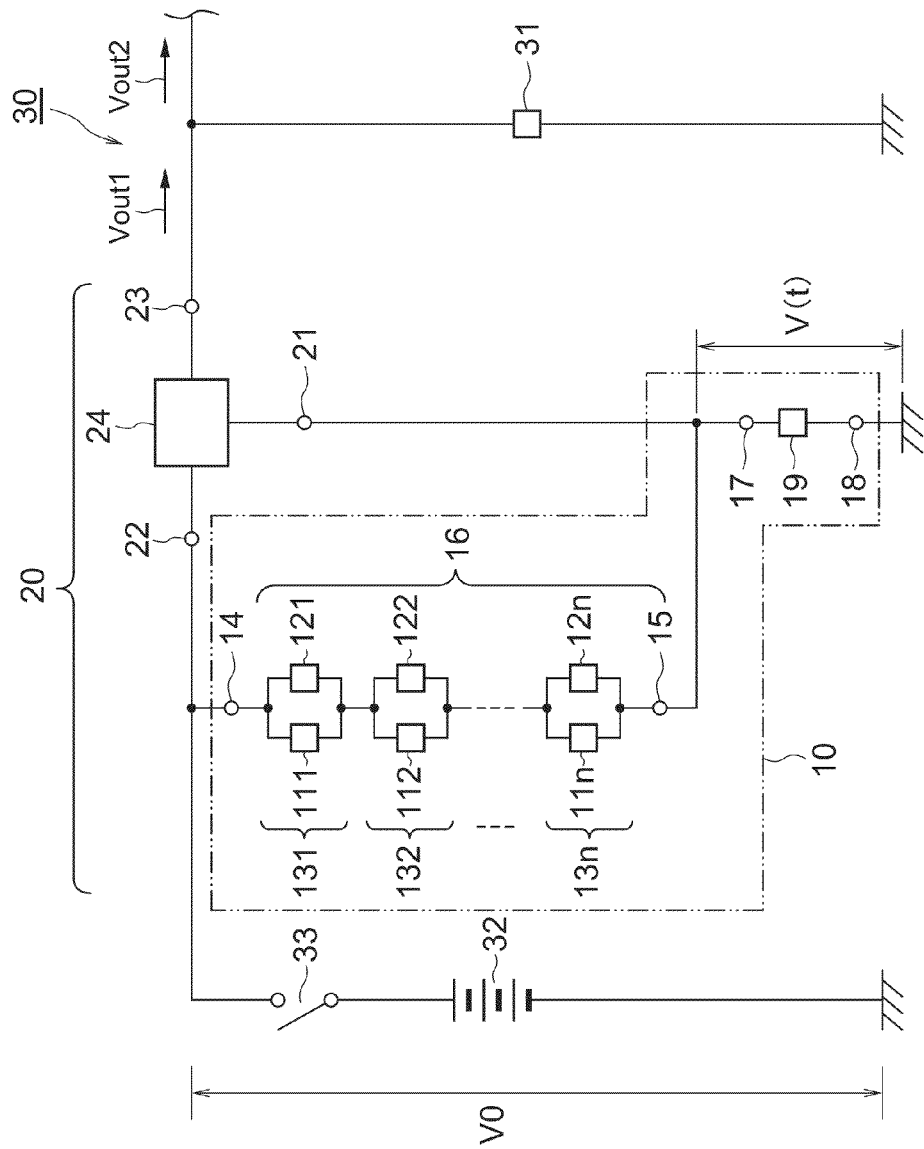
FIG. 1 is a block diagram showing a first exemplary embodiment.

FIG. 1 is a block diagram showing a first exemplary embodiment of the present invention. Explanations will be provided hereinafter by referring to FIG. 1.

A time constant circuit 10 according to the first exemplary embodiment includes: a series/parallel circuit 16 formed by serially connecting a plurality of parallel circuits 131, - - - which are structured with resistance elements 111, - - - and capacitance elements 121, - - - between a first terminal 14 and a second terminal 15; and a voltage-dividing resistance element 19 connected between a third terminal 17 connected to the second terminal 15 and a fourth terminal 18. The parallel circuit 131 is formed with the resistance element 111 and the capacitance element 121, the parallel circuit 132 is formed with the resistance element 112 and the capacitance element 122, - - - , and the parallel circuit 13$n$ is formed with the resistance element 11$n$ and the capacitance element 12$n$. Note that "n" is the number of the parallel circuits 131-13$n$, and it is an integer of 2 or larger.

Then, when a direct current voltage V0 is applied between the first terminal 14 and the second terminal 15 and an output voltage V(t) is acquired between the third terminal 17 and the fourth terminal 18, the output voltage V(t) changes depending of the sum of a plurality of exponential functions of different time constants. In other words, the first terminal 14 and the second terminal 15 are input terminals, and the third terminal 17 and the fourth terminal 18 are output terminals. In that case, when the direct current (DC) voltage V0 is applied between the input terminals, the output voltage V(t) acquired between the output terminals changes depending of the sum of the plurality of exponential functions of different time constants. The DC voltage V0 is supplied by a direct current (DC) power source 32 and a main switch 33.

With the time constant circuit 10, a following n-order fixed constant ordinary differential equation applies, provided that time is defined as "t" by having the point at which the DC voltage V0 is applied as "0".

$$(d/dt)^n V(t) + A_1 (d/dt)^{n-1} V(t) + \cdots + A_{n-1}(d/dt)V(t) + A_n V(t) + A_{n+1} = 0 \quad (1)$$

Note here that $A_1$ to $A_{n+1}$ are constants.

A solution of the equation (1) with the first exemplary embodiment is as follows.

$$V(t) = B_1 \exp(-c_1 t) + B_2 \exp(-c_2 t) + \cdots + B_n \exp(-c_n t) + B_{n+1} \quad (2)$$

Note here that $B_1$ to $B_{n+1}$ are constants, and $c_1$ to $c_n$ are attenuation constants (reciprocals of time constants).

The equation (2) indicates that the output voltage V(t) is affected by the sum of a plurality of exponential functions $B_1 \exp(-c_1 t)$, - - - . Each of the exponential functions is the function that monotonously attenuates, and there are ones that attenuate quickly and ones that attenuate slowly. Thus, the output voltage V(t) that is the sum of those functions is affected by the exponential functions that attenuate quickly immediately after the DC voltage V0 is applied, and comes to be affected by the exponential functions that attenuate slowly as the time passes. That is, the time constant circuit 10 can acquire the characteristic of the output voltage V(t) that attenuates gradually after attenuating steeply, compared to the output voltage acquired with the time constant circuit (Patent Document 1) that is formed with only a single parallel circuit (i.e., n=1), i.e., the output voltage characteristic that only attenuates monotonously.

The resistance elements 111 to 11$n$ and the voltage-dividing resistance element 19 may be any elements that have resistance values. For example, a separate-component resistor, a resistor formed within a monolithic IC, a transistor operating as a resistor, and the like may be employed. The capacitance elements 121 to 12$n$ may be any elements that have capacitance values. For example, a separate-component capacitor, a capacitor formed within a monolithic IC, a diode operating as a capacitor, a serial circuit formed with a capacitor and a resistor, and the like may be employed.

The resistance values of the resistance elements 111 to 11$n$ and the capacitance values of the capacitance elements 121 to 12$n$ may be any values, as long as the output voltage V(t) changes depending on the sum of the plurality of exponential functions of different time constants, i.e., as long as the solution of the equation (1) does not becomes an n-th root.

A switch circuit 20 according to the first exemplary embodiment includes the time constant circuit 10, a control terminal 21, and a semiconductor switch element 24 that has a first conductive terminal 22 and a second conductive terminal 23. The semiconductor switch element 24 is such a type in which between the first conductive terminal 22 and the second conductive terminal 23 becomes conductive when a specific voltage Vth is applied to the control terminal 21. Further, the first terminal 14 is connected to the first conductive terminal 22, and the third terminal 17 is connected to the control terminal 21.

The output voltage V(t) attenuates gradually after attenuating steeply by the effect of the time constant circuit 10. Further, the semiconductor switch element 24 has a characteristic of becoming conductive gradually as the voltage of the control terminal 21 changes gradually when the voltage of the control terminal 21 is in the vicinity of the specific voltage Vth. Thus, each condition is so set that the output voltage V(t) reaches the specific voltage Vth after attenuating steeply. The conditions are the resistance values of the resistance elements 111 to 11$n$ and the voltage-dividing resistance element 19, the capacitance values of the capacitance elements 121-12$n$, the specific voltage Vth, the DC voltage V0, and the like. As a result, the voltage of the control terminal 21 attenuates steeply, and then reaches the specific voltage Vth and attenuates gradually. Thereby, the semiconductor switch element 24 becomes conductive quickly and gradually.

The semiconductor switch element 24 is an FET, a bipolar transistor, a thyristor, or the like, for example. When the DC current V0 is positive, a p-channel type FET, a pnp-type bipolar transistor, or the like is suitable. When the DC current V0 is negative, an n-channel type FET, an npn-type bipolar transistor, or the like is suitable.

A DC/DC converter 30 according to the first exemplary embodiment includes the switch circuit 20 and a smoothing capacitance element 31 that is connected between the second conductive terminal 23 and the fourth terminal 18. An IC, a component, and the like for a constant voltage power source are connected to the output side of the smoothing capacitance element 31 as necessary.

When the semiconductor switch element 24 starts up quickly and becomes conductive gradually, the switch circuit 20 starts up without delay and an output voltage Vout1 is increased gradually. Thus, the rush current to the smoothing capacitance element 31 can be decreased sufficiently without delaying the starting point of an output voltage Vout2 of the DC/DC converter 30. Note that "terminal" in this Specification includes a simple conductor, and it is not limited to a physical or mechanical terminal. Similarly, "to connect" means to make things in a same potential, and it is not limited to a physical or mechanical connection.

As an exemplary advantage according to the invention, the time constant circuit is structured by using a serial-parallel circuit in which a plurality of parallel circuits for resistance elements and capacitance elements are connected in series; therefore, it is possible to acquire the characteristic of the output voltage of the time constant circuit, with which the voltage gradually attenuates after attenuating steeply.

Second Exemplary Embodiment

Figure 2:
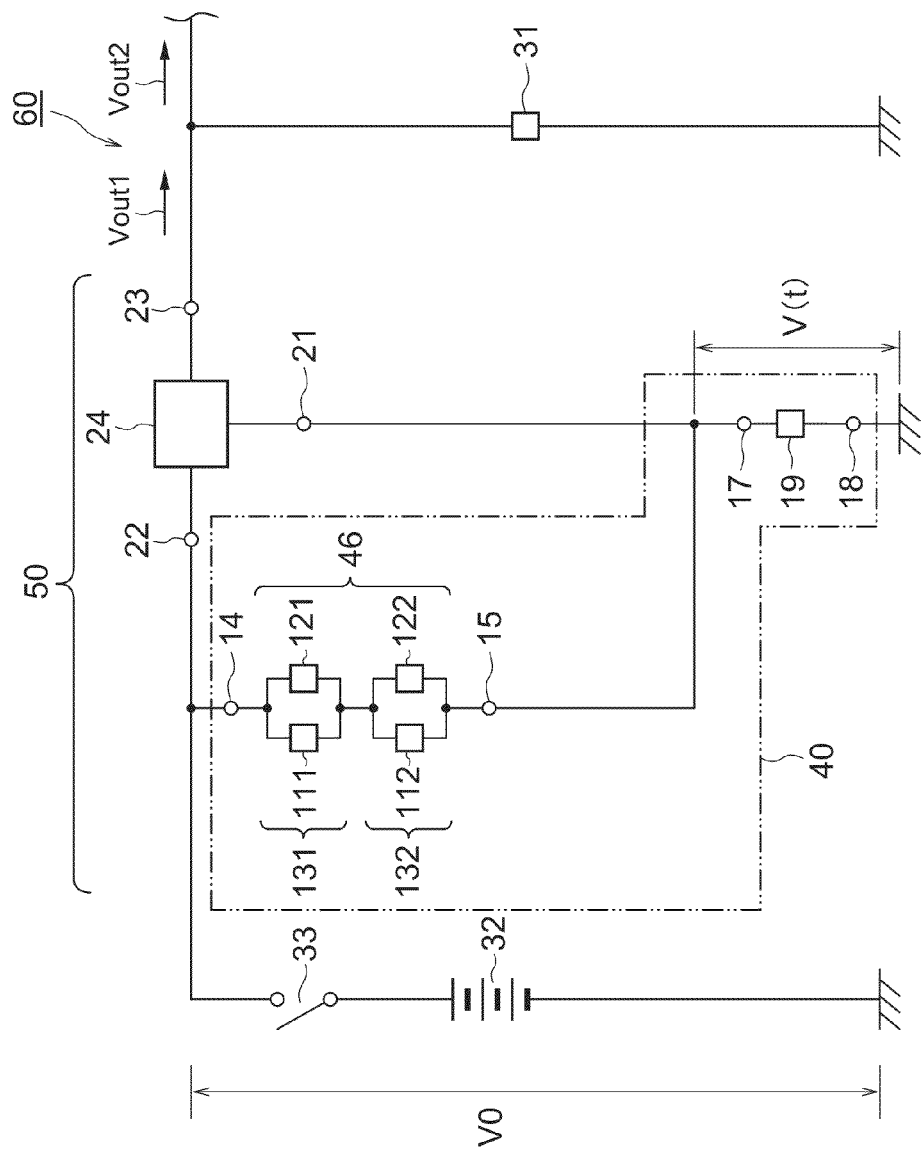
FIG. 2 is a block diagram showing a second exemplary embodiment.

FIG. 2 is a block diagram showing a second exemplary embodiment of the present invention. Explanations will be provided hereinafter by referring to FIG. 2. Same reference numerals as those of FIG. 1 are applied to the same structural elements in FIG. 2 as those of FIG. 1.

A time constant circuit 40 according to the second exemplary embodiment is so characterized that a serial-parallel circuit 46 is formed with a first parallel circuit 131 and a second parallel circuit 132 in the structure of the first exemplary embodiment. In this case, a first exponential function and a second exponential function are derived approximately from the sum of the plurality of exponential functions of the equation (2) described in the first exemplary embodiment. The output voltage V(t) changes according to the first exponential function immediately after the DC voltage V0 is applied until a specific time t1, and changes according to the second exponential function after the specific time t1.

That is, since "n=2" in the equation (1), a following 2nd-order fixed coefficient ordinary differential equation can be acquired.

$$(d/dt)^2 V(t) + A_1 (d/dt) V(t) + A_2 V(t) + A_3 = 0 \qquad (3)$$

A solution of the equation (3) with the second exemplary embodiment is as follows.

$$V(t) = B_1 \exp(-c_1 t) + B_2 \exp(-c_2 t) + B_3 \qquad (4)$$

The equation (4) indicates that the output voltage V(t) is affected by the sum of the two exponential functions $B_1 \exp(-c_1 t)$ and $B_2 \exp(-c_2 t)$. In the second exemplary embodiment, one of those exponential functions attenuates relatively quickly, and the other exponential function attenuates relatively slowly. Thus, the output voltage V(t) is affected by the exponential function that attenuates quickly from the point immediately after the DC voltage V0 is applied until the specific time t1, and comes to be affected by the exponential function that attenuates slowly after the specific time t1.

Provided that the output voltage from the point immediately after the DC voltage V0 is applied to the specific time t1 is V1(t) and the output voltage after the specific time t1 is V2(t), V1(t) and V2(t) can be approximately expressed with following equations based on the equation (4).

$$V1(t) = D_1 \exp(-E_1 t) + D_2 \qquad (5)$$

$$V2(t) = F_1 \exp(-G_1 t) + F_2 \qquad (6)$$

Note here that $D_1$, $D_2$, $F_1$, $F_2$ are constants, $E_1$, $G_1$ are attenuation constants (reciprocals of time constants), and $E_1 > G_1$.

That is, the output voltage V(t) is expressed with the equation (5) as the first exponential function from the point immediately after the DC voltage V0 is applied until the specific time t1, and expressed with the equation (6) as the second exponential function after the specific time t1. With the time constant circuit 40, it is possible to acquire the characteristic of the output voltage V(t) that attenuates gradually with the attenuation coefficient $G_1$ after attenuating steeply with the attenuation coefficient $E_1$, compared to the characteristic of the output voltage that only attenuates monotonously. This corresponds to the fact that one of the two capacitance elements 121 and 122 contained in the serial-parallel circuit 46 is charged quickly, and the other capacitance element is charged slowly.

Further, it may also be defined that following expression applies, provided that the resistance value of the resistance element 111 of the first parallel circuit 131 is R1, the capacitance value of the capacitance element 121 of the first parallel circuit 131 is C1, the resistance value of the resistance element 112 of the second parallel circuit 132 is R2, and the capacitance value of the capacitance element 122 of the second parallel circuit 132 is C2.

$$C1 > C2 \text{ and } R1 > R2 \qquad (7)$$

In that case, since the capacitance value C2 of the capacitance element 122 of the second parallel circuit 132 is smaller than the capacitance value C1 of the capacitance element 121 of the first parallel circuit 131, charging of the capacitance element 122 is completed with a smaller integrated value of charging currents than an integrated value of charging currents flown to the capacitance element 121. Moreover, since the resistance value R2 of the resistance element 112 of the second parallel circuit 132 is smaller that the resistance value R1 of the resistance element 111 of the first parallel circuit 131, the capacitance element 122 reaches the final changing voltage securely faster than the capacitance element 121. This means that the attenuation coefficient $E_1$ of the equation (5) can be set still larger and that the attenuation coefficient $G_1$ of the equation (6) can be set still smaller.

Therefore, through employing the condition of the expression (7), it is possible with the time constant circuit 40 to acquire the characteristic of the output voltage V(t) that attenuates more gradually after attenuating more steeply, compared to the characteristic of the output voltage that only attenuates monotonously. This corresponds to the fact that the capacitance element 122 out of two capacitance elements 121 and 122 contained in the serial-parallel circuit 46 is charged more quickly, and the capacitance element 121 is charged more slowly.

When the expression (7) applies, it may be so defined that a following expression applies provided that the resistance value of the voltage-dividing resistance element 19 is R3.

$$R3 \times C1 > 100 \text{ k}\Omega \cdot \mu F \tag{8}$$

In this case, sufficiently small attenuation coefficient $G_1$ can be acquired, so that it is possible to acquire the characteristic of the output voltage V(t) that attenuates extremely gradually after attenuating steeply.

A switch circuit 50 according to the second exemplary embodiment includes the time constant circuit 40 and a semiconductor switch element 24. The output voltage V(t) reaches the specific voltage Vth after the specific time t1 has passed from the point at which the DC voltage V0 is applied.

The output voltage V(t) of the time constant circuit 40 steeply attenuates until the specific time t1, and gradually attenuates after the specific time t1. Thus, the voltage of the control terminal 21 equivalent to the output voltage V(t) attenuates quickly until the specific time t1, thereafter reaches the specific voltage Vth with which the semiconductor switch element 24 becomes conductive, and attenuates gradually. Thereby, the semiconductor switch element 24 becomes conductive quickly and gradually.

Further, the switch circuit 50 may be embodied in a concretive manner as follows. The semiconductor switch element 24 is a p-channel type FET 24, the first and second conductive terminals 22, 23 are a source terminal 22 and a drain terminal 23, respectively, the control terminal 21 is a gate terminal 21, and the specific voltage Vth is a threshold voltage Vth of the FET 24. Note here that same reference numerals are applied to respective corresponding structural elements in the concretive form for making it easier to comprehend.

In this case, the output voltage V(t) of the time constant circuit 40 steeply attenuates until the specific time t1, and gradually attenuates after the specific time t1. Thus, the voltage of the gate terminal 21 equivalent to the output voltage V(t) attenuates quickly until the specific time t1, thereafter reaches the specific voltage Vth with which the semiconductor switch element 24 becomes conductive, and attenuates gradually. Thereby, the FET 24 becomes conductive quickly and gradually. The FET 24 may be of any types such as a MOS (Metal Oxide Silicon), a junction type, and the like.

A DC/DC converter 60 according to the second embodiment includes the switch circuit 50 and a smoothing capacitance element 31. The smoothing capacitance element 31 is connected between the drain terminal 23 and the fourth terminal 18 of the FET 24.

Because the FET 24 quickly and gradually becomes conductive, there is no delay in starting the switch circuit 50 and the output voltage Vout1 of the switch circuit 50 increases gradually.

Therefore, it is possible to sufficiently decrease the rush current to the smoothing capacitance element 31 without delaying the starting point of the output voltage Vout2 of the DC/DC converter 60.

Other structures, operations, and effects of the second exemplary embodiment are the same as those of the first exemplary embodiment.

Third Exemplary Embodiment

Figure 3:
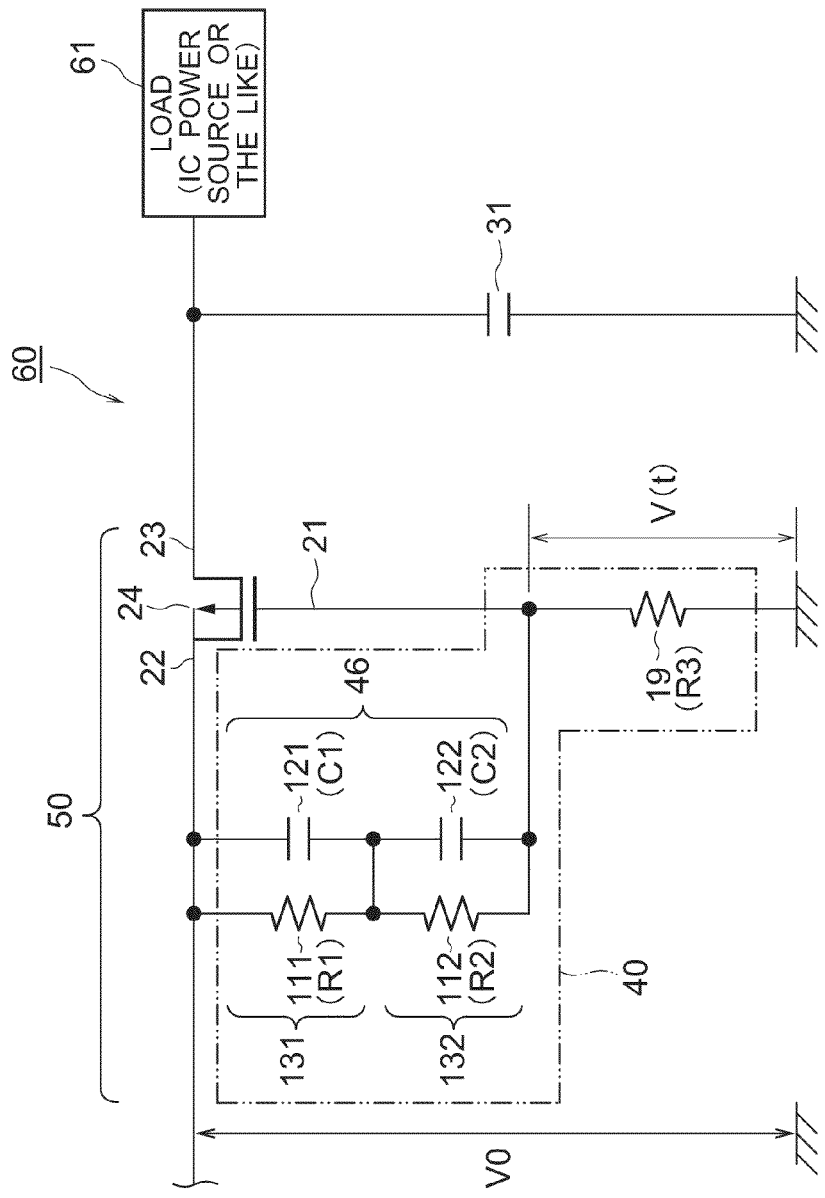
FIG. 3 is a circuit diagram showing a third exemplary embodiment.

FIG. 3 is a block diagram showing a third exemplary embodiment of the present invention. Explanations will be provided hereinafter by referring to FIG. 3. Same reference numerals as those of FIG. 2 are applied to the same structural elements in FIG. 3 as those of FIG. 2.

The third exemplary embodiment is a more concretive embodiment of the structure of the second exemplary embodiment. Note here that same reference numerals are applied to respective corresponding structural elements in the concretive form for making it easier to comprehend. In FIG. 3, the first and second terminals 14, 15, the third and fourth terminals 17, 18, the DC power source 32, and the main switch 33 shown in FIG. 2 are omitted for simplification. Further, a load 61 such as an IC power source is connected to the output side of the smoothing capacitance element 31.

In the third exemplary embodiment, a time constant circuit 40 is provided between a gate terminal 21 and a source terminal 22 of an FET 24 that functions as a switch for keeping the starting order of the power source. The time constant circuit 40 is formed with a resistance element 111 (resistance value R1), a resistance element 112 (resistance value R2), a capacitance element 121 (capacitance value C1), and a capacitance element 122 (capacitance value C2). The smoothing capacitance element 31 is disposed on the output side of the FET 24, and it can be considered as a capacitor for corresponding to a steep transitional response of the load 61. A voltage-dividing resistance element 19 (resistance value R3) is a resistor for determining the potential of the gate terminal 21. The load 61 of the IC or the like for driving a display device is disposed ahead the drain terminal 23 of the FET 24.

Changes in the gate potential of the FET 24 will be investigated in a case where the DC voltage V0 generated within a DC/DC converter 60 is applied to the source terminal 22 side of the FET 24 or in a case where the DC voltage V0 is inputted from the outside the source terminal 22 side. The FET 24 is used as a switch for controlling the starting order of the DC/DC converter 60 or used as a switch for controlling the starting order of the inputted voltage. Hereinafter, the "gate terminal 21", the "source terminal 22", and the drain terminal 23" are simply referred to as a "gate", a "source", and a "drain".

Immediately after the DC voltage V0 is applied to the FET 24, the gate potential of the FET 24 becomes V0. Subsequently, the gate potential of the FET 24 changes as the time passes with a slope determined according to the time constant of the time constant circuit 40 between the gate and the source of the FET 24. At last, the gate potential of the FET 24 after a sufficient length of time has passed becomes a potential expressed as follows.

$$V0 \times (R3)/(R1+R2+R3)$$

Changes in the gate potential of the FET 24 with this circuit structure until a sufficient length of time has passed from the point at which the DC voltage V0 is applied to the source of the FET 24 will be described hereinafter in detail.

First, in FIG. 3, immediately after the DC voltage V0 is applied to the source side of the FET 24, each of the capacitance elements 121 and 122 virtually becomes short-circuited. Thus, the gate potential of the FET 24 becomes V0, and the potential between the gate and the source of the FET 24 becomes 0 V (no potential difference). Note here that it is desirable for the capacitance value C1 to be sufficiently larger than the capacitance value C2. In the third exemplary embodiment, the capacitance value C1 is set to be 10 times as large as the capacitance value C2. After applying the DC voltage V0, the capacitance elements 121 and 122 are charged as the time passes. At this time, charging of the capacitance element 122 with the capacitance value C2 is completed earlier, since the capacitance value C2 is smaller than the capacitance value C1. The change in the gate potential of the FET 24 in time t until the charging of the capacitance element 122 is completed can be expressed approximately with Expression 1 as follows.

$$V1(t)=V0 \times [R3/(A \times R2+R3)+(A \times R2)/(A \times R2+R3) \times \exp(-t/\alpha 1)]$$ Expression 1 where, $$\alpha 1 = [(A \times R3 \times R2)/(A \times R2+R3)] \times C2$$

$$A = [1+(C2/C1) \times (R1/R2)]$$

The value of α1 shows the time constant determined according to R2, R3, and C2. The value of A is a coefficient that takes charging of the capacitance element 121 conducted until charging of the capacitance element 122 is completed into consideration. That is, while the capacitance element 122 is being charged, the capacitance element 121 is also being charged naturally. At that time, considering that electric charges at the contact between the capacitance element 121 and the capacitance element 122 is saved, the same electric charges are to be stored in the capacitance element 121 as that the capacitance element 122 when charging of the capacitance element 122 is completed, and the gate potential of the FET 24 drops for that. That is, the value of A is a value acquired by taking that into consideration.

Next, the gate potential of the FET 24 in the time passages after completing the charging of the capacitance element 122 will be described.

Immediately after charging of the capacitance element 122 is completed, the capacitance element 121 also has the electric charge amount equivalent to the electric charge amount the capacitance element 122 has stored (according to the value of A described above). From this point, charging to the capacitance element 121 is conducted further. However, charging of the capacitance element 122 is completed, so that it is considered that the capacitance element 122 is in an open state (i.e., equivalent to having no capacitance element 122). Therefore, the change in the gate potential of the FET 24 in time t after the charging of the capacitance element 122 is completed can be expressed approximately with Expression 2 as follows.

$$V2(t)=V0 \times [\{R3/(R2+R3)\} \times \{(R2+R3)/(R1+R2+R3)\}+\{R1/(R1+R2+R3)\} \times \exp(-t/\alpha 2)\}]$$ Expression 2 where, $$\alpha 2=[\{R1 \times (R2+R3)\}/(R1+R2+R3)] \times C1$$

As described above, the gate potential of the FET 24 changes according to V1(t) that is expressed with Expression 1 until charging of the capacitance element 122 is completed, and changes according to V2(t) that is expressed with Expression 2 after charging of the capacitance element 122 is completed.

Figure 4:
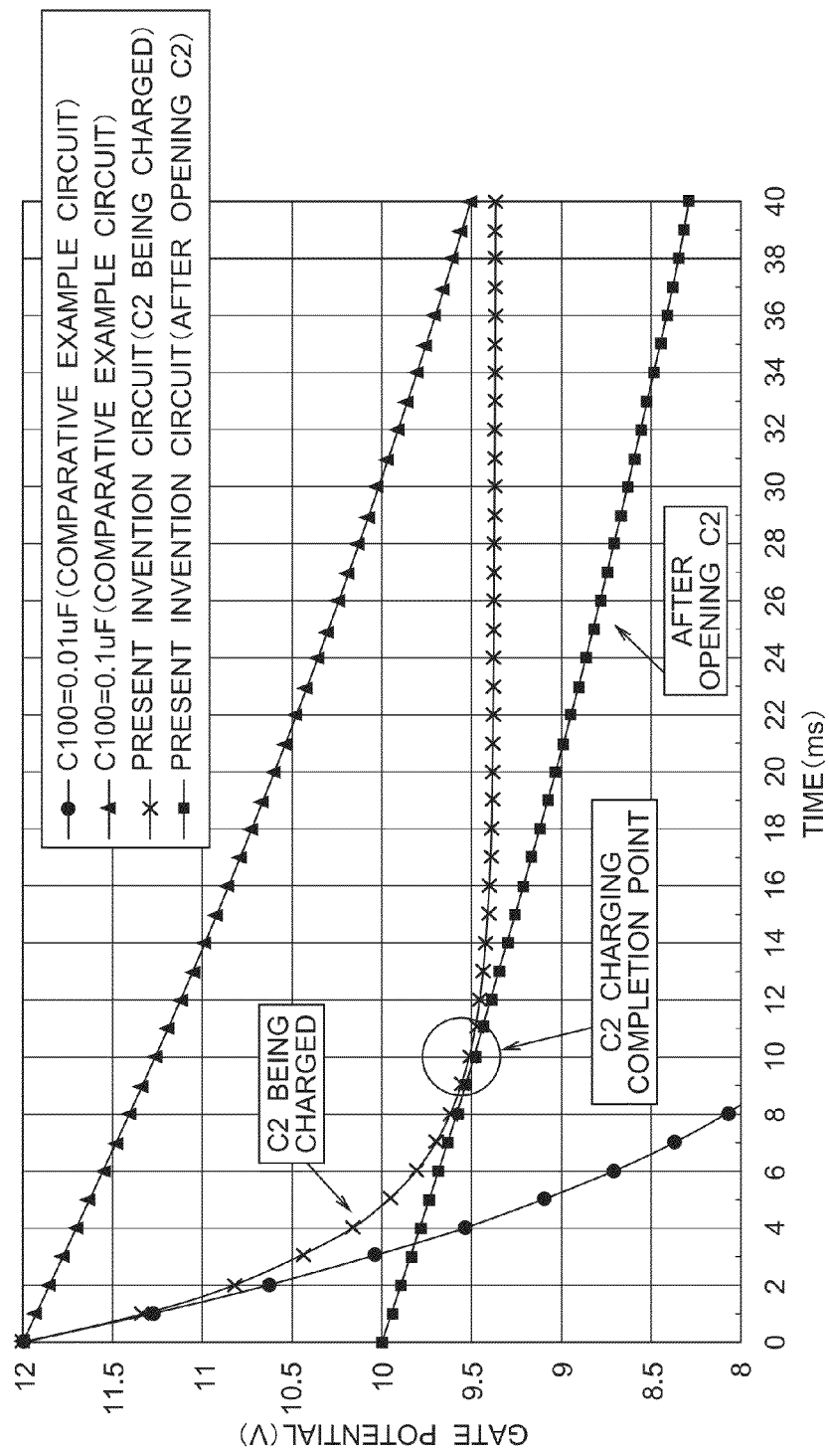
FIG. 4 is a first graph showing changes in the gate potentials of FETs of the third exemplary embodiment and a comparative example.
Figure 5:
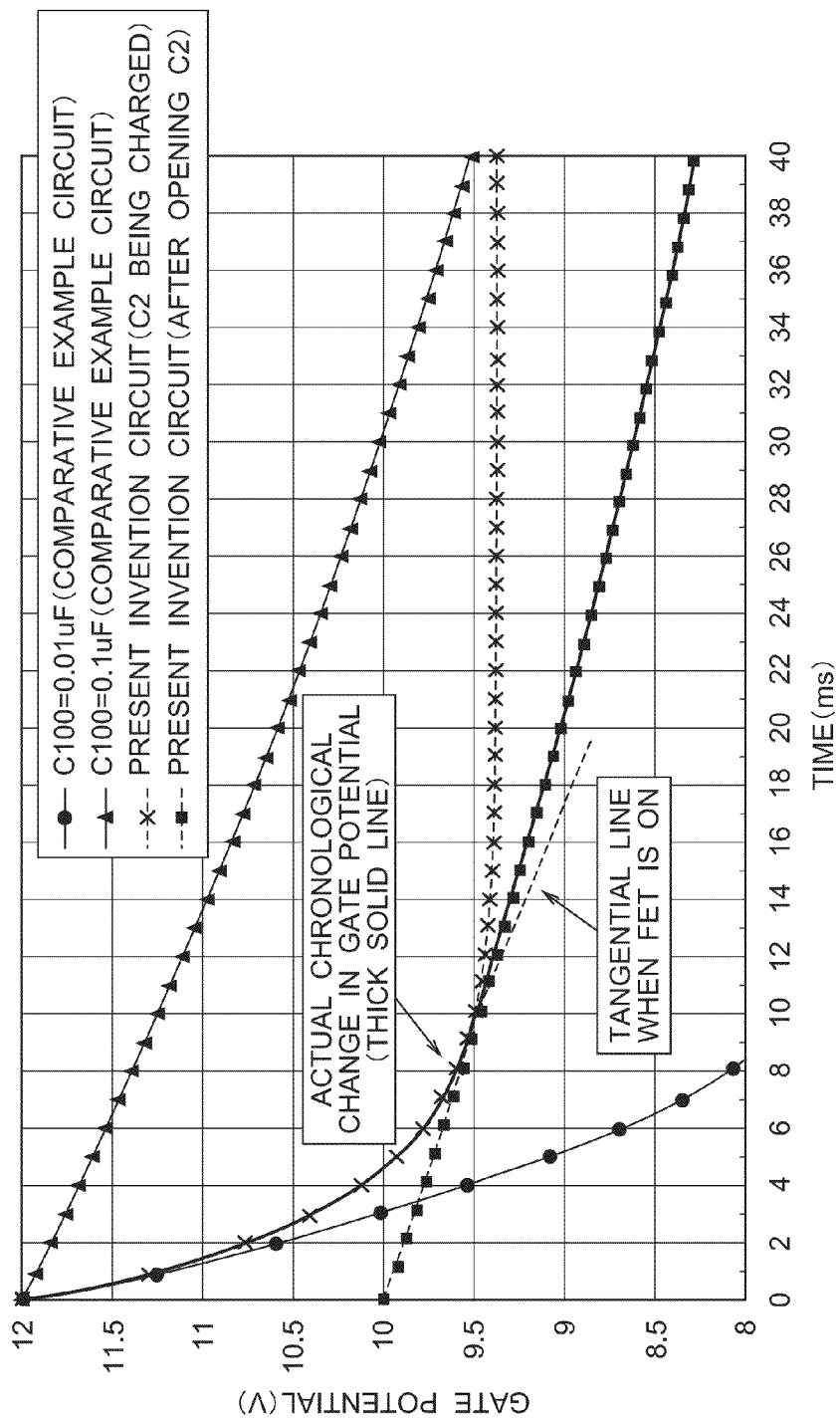
FIG. 5 is a second graph showing changes in the gate potentials of FETs of the third exemplary embodiment and the comparative example.

FIG. 4 and FIG. 5 are graphs showing changes in the gate potentials of the FET 24 according to the third exemplary embodiment and a comparative example. Hereinafter, explanations will be provided by referring to FIG. 3-FIG. 5.

FIG. 4 and FIG. 5 show the changes in the gate potentials of the FET 24 under four conditions, in which the lateral axis is the time (ms) and the longitudinal axis is the gate potential (V). The four conditions are: a case of the comparative example to be described later in which the capacitance value C100 is set as 0.01 µF; a case of the comparative example in which the capacitance value C100 is set as 0.1 µF; a case of the third exemplary embodiment in which the capacitance element 122 is being charged; and a case of the third exemplary embodiment after the capacitance element 122 is opened. In FIG. 4 and FIG. 5, the "third exemplary embodiment" and the "capacitance element 122" are simply referred to as the "present invention" and "C2", respectively. Explanations of "charging" and "open" are inserted in FIG. 4, and a slope (tangential line) of the gate potential of an ON-voltage of the FET is plotted in FIG. 5. Further, in FIG. 5, the actual time variation in the gate potential is plotted with a thick solid line.

As shown in FIG. 4 and FIG. 5, it can be seen that the gate potential of the FET 24 in the third exemplary embodiment changes steeply up to the point where the charging of the capacitance element 122 is completed, and changes gradually after charging of the capacitance element 122 is completed.

In the third exemplary embodiment, the capacitance value C2 is set smaller than the capacitance value C1 and appropriate values are employed for the resistance values R1, R2, R3 so as to make the change in the gate potential of the FET 24 steep immediately after applying the DC voltage V0 and to make the change gradual after completing charging of the capacitance element 122. Thereby, the slope in the gate potential before and after the FET 24 becomes ON can be controlled. As a result, it is possible to shorten the time until the FET 24 starts up as much as possible, while decreasing the rush current when starting up the FET 24.

Each constant regarding the time constant circuit 40 can be calculated from V1(t) and V2(t) expressed with Expression 1 and Expression 2. That is, the resistance value and the capacitance value are selected in such a manner that V1(t) and V2(t) reach an actual operating voltage X of the FET 24 at the timing at which charging of the capacitance element 122 is completed. Note that "actual operating voltage X" can be defined as "X=Vs−Vg", provided that the source potential and the gate potential of the FET 24 are defined as Vs and Vg, respectively. The "actual operating voltage X" corresponds to "specific voltage (threshold voltage) Vth" in the first and second exemplary embodiments.

In the third exemplary embodiment, the values are defined as follows when the DC voltage V0 is 12 V and the actual operating voltage X is 2.5 V.

R1=1.2 MΩ
R2=300 kΩ
R3=1.5 MΩ

C1=0.1 μF
C2=0.01 μF $$R1/R2=4 \qquad \text{Expression a}$$

$$(R1+R2)/R3=1 \qquad \text{Expression b}$$

$$C1/C2=10 \qquad \text{Expression c}$$

$$R2 \times C2 = 3 \text{ k}\Omega \cdot \mu F \qquad \text{Expression d}$$

The relations expressed in the left sides of Expressions a-d take optimum values (right sides) that vary according to the values of the DC voltage V0 and the actual operating voltage X. However, those are based on the ratios expressed in the right sides of Expressions a-d, so that the relational expressions of a-d are important when selecting each of the values of the resistance elements 111, 112, the voltage-dividing resistance elements 19, and the capacitance elements 121, 122. That is, through applying Expression a-d, proper values can be derived even when the DC voltage V0, the actual operating voltage X, and other conditions are changed. Further, details of the generalized relational expressions of a-d will be described. First, regarding Expression a, the resistance value R2 of the resistance element 112 is greatly affected by the resistance value R3 of the voltage-dividing resistance element 19.

For example, when "t" regarding V2(t) is 0, there is obtained a following from Expression 2.

$$V2(0)=V0 \times (R3/(R2+R3))$$

This shows that an intercept of V2(0) in FIG. 4 is V0×(R3/(R2+R3)).

Further, when C2 is set sufficiently smaller than C1 in Expression 1, there are obtained followings.

$$C2/C1 \approx 0, A \approx 1, \alpha 1 \approx 0$$

Thus, there is obtained a following.

$$V1(t)=V0 \times (R3/(R2+R3))$$

This means that the gate potential becomes V0 at an instant where the voltage is applied to the FET 24 even when C2 is set smaller than C1 as much as possible, but it turns to the value of V0×(R3/(R2+R3)) immediately thereafter. When this potential difference is considered as the potential difference between the gate and the source of the FET 24, it can be expressed as follows.

$$V0-(V0 \times (R3/(R2+R3)))=V0 \times (R2/(R2+R3))$$

That is, it is necessary to make the voltage value "V0×(R2/(R2+R3))" smaller than the actual operating voltage of the FET 24. If not, the gate potential may reach the actual operating voltage of the FET 24 before the change in the gate potential of the FET 24 becomes gradual. It is needless to mention that the rush current cannot be decreased if the FET 24 starts up before the change in the gate potential of the FET 24 becomes gradual.

Thereby, in a case where the actual operating voltage of the FET is assumed as X (V), it is necessary to select R2 and R3 which satisfy a following conditional expression $$X > V0 \times (R2/(R2+R3)) \qquad \text{Expression e}$$

X—Actual operating voltage of FET 24
V0—Voltage applied between source and GND of FET 24
R2—Resistance of resistance element 112 of time constant circuit 40
R3—Resistance of voltage-dividing resistance element 19 for determining gate potential With the third exemplary embodiment, V0=12 V, R2=300 kΩ, and R3=1500 kΩ, so that there is obtained X>2.0 V. Since X=2.5 V, Expression e is satisfied.

Next, the resistance value R1 of the resistance element 111 will be described in details. R1 is the resistance value for determining the gate potential of the FET 24 after a sufficient length of time has passed from the point at which the voltage is applied between the source and GND of the FET 24. Note here that it is necessary for the potential difference between the gate and the source of the FET 24 to be in a value that is equal to or larger than the actual operating voltage X of the FET 24 after the sufficient length of time has passed. It is because the FET 24 does not start up (the FET 24 cannot be turned ON), when the potential difference between the gate and the source of the FET 24 has not reached the actual operating voltage X.

Therefore, R1 needs to be selected to satisfy a following conditional expression.

$$X < V0 \times (R3)/(R1+R2+R3) \qquad \text{Expression f}$$

X—Actual operating voltage of FET 24
V0—Voltage applied between source and GND of FET 24
R1—Resistance of resistance element 111 of time constant circuit 40
R2—Resistance of resistance element 112 of time constant circuit 40
R3—Resistance of voltage-dividing resistance element 19 for determining gate potential With the third exemplary embodiment, V0=12 V, R1=1200 kΩ, R2=300 kΩ, and R3=1500 kΩ, so that there is obtained X<6.0 V. Since X=2.5 V, Expression f is satisfied.

Next, the capacitance value C1 of the capacitance element 121 will be described in details. C1 becomes an important parameter for decreasing the rush current in the third exemplary embodiment, because it is presupposed in the third exemplary embodiment that charging of the capacitance element 122 (capacitance value C2) is completed earlier. That is, it is because C1 needs to be set larger than C2, and the gate potential of the FET 24 changes with the time constant determined according to C1, R2, and R3 after charging of the capacitance element 122 is completed.

Since the change in the gate potential of the FET 24 becomes gradual after charging of the capacitance element 122 is completed, it is necessary to have the actual operating voltage X of the FET 24 in the gradual voltage region. This is because a period where charging of the capacitance element 122 becomes a period where the gate potential of the FET 24 changes steeply, so that it is necessary to avoid that period. If the gate potential reaches the actual operating voltage X in the period where the gate potential of the FET 24 is changing steeply, the rush current at the time of starting up the FET 24 becomes great. Therefore, it is necessary to select the value of C1 by taking R2 and R3 into consideration, so that the rush current can be decreased sufficiently.

Here, a "comparative example" is investigated for obtaining the optimum resistance value C1. A time constant circuit of the comparative example is formed with a parallel circuit of a single resistance element and a single capacitance element, and this corresponds to the technique disclosed in Patent Document 1. Further, a switch circuit and a DC/DC converter in which the time constant circuit in the structure of the third exemplary embodiment is replaced with that of the comparative example are taken as "a switch circuit and a DC/DC converter of the comparative example".

Provided that "dV2(t)/dt" is a "slope", the slope in the vicinity of the actual operating voltage of the FET 24 needs to be larger than the slope in the vicinity of the actual operating voltage of the FET of the comparative example for sufficiently decreasing the rush current. First, the slope in the actual operating voltage of the FET of the comparative example and the time (t1) required until reaching the actual operating voltage are obtained.

Figure 8:
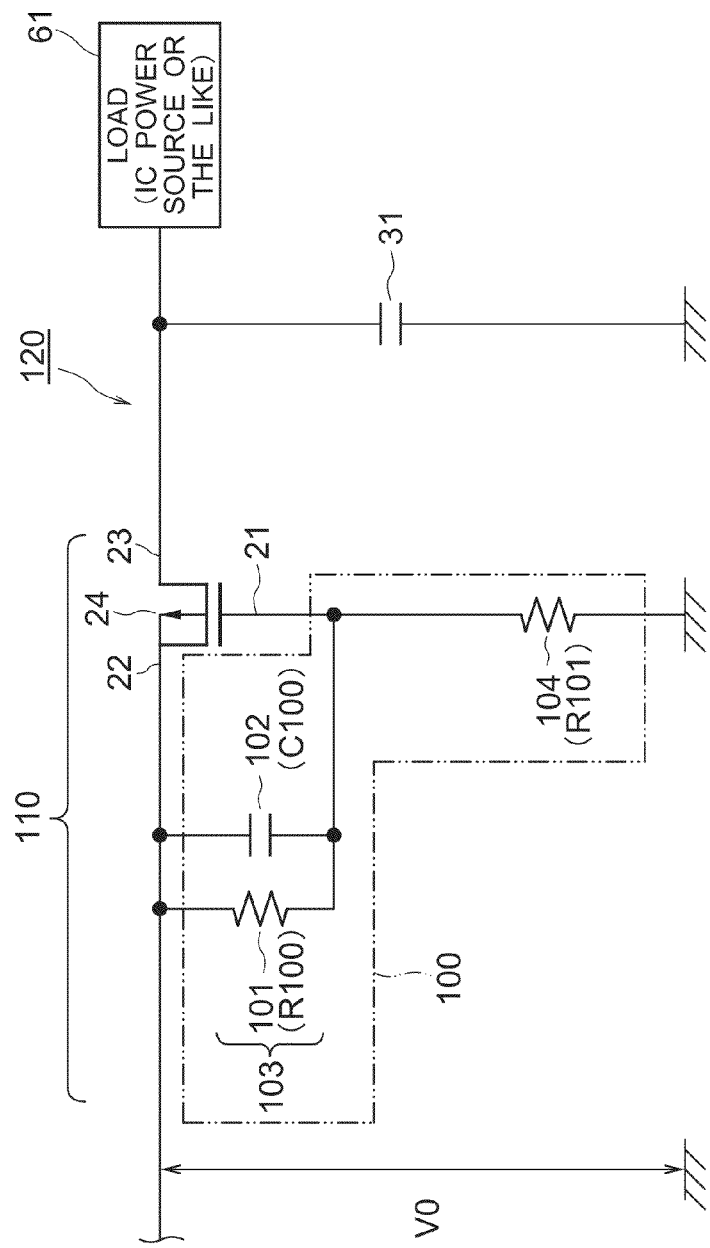
FIG. 8 is a circuit diagram showing a comparative example.

At first, the circuit structure of the comparative example will be discussed. FIG. 8 is a circuit diagram showing the comparative example. Hereinafter, explanations will be provided while making comparisons between the third exemplary embodiment and the comparative example by referring to FIG. 3 and FIG. 8. Same reference numerals as those of FIG. 3 are applied to same structural elements of FIG. 8 as those of FIG. 3.

A time constant circuit 100 of the comparative example includes a parallel circuit 103 that is configured with a resistance element 101 (resistance value R100) and a capacitance element 102 (capacitance value C100), and a voltage-dividing resistance element 104 (resistance value R101).

A switch circuit 110 includes the time constant circuit 100 and an FET 24. A DC/DC converter 120 includes the switch circuit 110 and a smoothing capacitance element 31. A difference is that the time constant circuit 100 of the comparative example only has a single RC parallel circuit, while the time constant circuit 40 (FIG. 3) of the third exemplary embodiment has two RC parallel circuits.

The time variation in the gate potential in the circuit structure of the comparative example can be expressed by following Expression 3.

$$V3(t)=V0\times[R101/(R100+R101)+\{R100/(R100+R101)\}\times\exp(-t/\alpha 3)] \quad \text{Expression 3}$$

where, $$\alpha 3=[(R100\times R101)/(R100+R101)]\times C100$$

A following can be obtained when Expression 3 mentioned above is differentiated with respect to time.

$$dV3(t)/dt=-(V0/(R101\times C100))\times\exp(-t/\alpha 3)$$

When the resistance values R1, R2, R3 and the capacitance value C1 of the third exemplary embodiment are replaced with the resistance values R100, R101 and the capacitance value C100, the values can be considered as follows.

$$R100=R1+R2, R101=R3, C100=C1$$

Thereby, a following can be obtained.

$$dV3(t)/dt=-(V0/(R3\times C1))\times\exp(-t/\alpha 3) \quad \text{Expression g}$$

where, $$\alpha 3=((R1+R2)\times R3\times C1/(R1+R2+R3))$$

The slope in the gate potential (time variation rate) in the actual operating voltage of the FET 24 according to the comparative example can be obtained from Expression g.

Further, provided that the actual operating voltage of the FET 24 is "X", the time t1 required to reach the actual operating voltage of the FET 24 can be expressed as follows by using Expression 3 (as described above, it is assumed that R100=R1+R2, R101=R3, C100=C1).

$$t1=-((R3\times C1)/2)\times\ln((R3/(R1+R2))-((R2+R3)/R2)\times(X/V0)) \quad \text{Expression h}$$

(t1=40 ms in the third exemplary embodiment)

Now, returning to the circuit structure of the third exemplary embodiment, the slope of the gate potential in the actual operating voltage of the FET 24 is obtained in the same manner. In the third exemplary embodiment, charging of the capacitance element 122 already has to be completed in the vicinity of the actual operating voltage of the FET 24. The time variation in the gate potential of the FET 24 at this time is expressed by using Expression 2, and the slope of the gate potential in the actual operating voltage of the FET 24 can be obtained as follows by performing differentiation of Expression 2 with respect to time.

$$dV2(t)/dt=-(V0\times R3)/((R2+R3)\times(R2+R3)\times C1)\times\exp(-t/\alpha 2) \quad \text{Expression i}$$

where, $$\alpha 2=(R1\times(R2+R3)\times C1)/(R1+R2+R3)$$

In time t1 shown with Expression h, the slope according to the third exemplary embodiment obtained from Expression i needs to be smaller than the slope according to the comparative example obtained from Expression g. Further, in time t1, the gate potential of the FET 24 according to the third exemplary embodiment needs to have reached the actual operating voltage.

Therefore, following two expressions apply according to those conditions.

$$|dV3(t1)/dt|>|dV2(t1)/dt| \quad \text{Expression j}$$

$$V0\text{-}V2(t1)>X \quad \text{Expression k}$$

where, $$t1=((R3\times C1)/2)\times\ln((R3/(R1+R2))-((R2+R3)/R2)\times(X/V0))$$

In the third exemplary embodiment, dV3(t1)/dt=−0.047 and dV2(t1)/dt=−0.032, so that Expression j is satisfied. Further, V0−V2(t1)=3.7 and X=2.5, so that Expression k is satisfied. As described, it is necessary to select the capacitance value C1 to satisfy Expression j and Expression k mentioned above.

Next, the capacitance value C2 will be described in details.

C2 becomes an important parameter for shortening the starting point of the FET 24 as much as possible with the third exemplary embodiment. Also, as is the feature of the third exemplary embodiment, it is necessary to complete charging of the capacitance element 122 earlier regarding the capacitance element 121 (capacitance value C1) and the capacitance element 122 (capacitance value C2), so that it is necessary to satisfy C1>C2. Further, in order to achieve the effects of the third exemplary embodiment fully, it is desirable to select C2 to satisfy a relation of "C1>5×C2". The smaller the value of C2 with respect to the value of C1 in Expression 1, the more the delay amount of the starting point of the FET 24 can be shortened. As described above, when selecting the resistance values R1, R2, R3 and the capacitance values C1, C2 of the time constant circuit 40 shown in FIG. 3, values that satisfy Expression e-Expression k are to be selected.

More specifically, it is important to select values that satisfy Expression e-Expression k and satisfy following ratios or expressions in order to fully achieve the effects of the third exemplary embodiment (shorten the starting point of the FET 24 as much as possible, while decreasing the rush current).

$$R3\times C1>100\text{ k}\Omega\cdot\mu F \quad \text{Expression 1}$$

$$C1/C2>5 \quad \text{Expression m}$$

$$0.5<(R1+R2)/R3<2 \quad \text{Expression n}$$

$$2<(R1/R2)<14 \quad \text{Expression o}$$

In the concretive example of the third exemplary embodiment, values are defined as R3×C1=150, C1/C2=10, (R1+R2)/R3=1, and R1/R2=4.

Other structures, operations, and effects of the third exemplary embodiment are the same as those of the first and second exemplary embodiments.

(More Detailed Explanations Regarding Third Exemplary Embodiment)

Next, the third exemplary embodiment will be described in more details by referring to FIG. 3 and the like.

FIG. 3 shows peripheral circuits of the FET 24 within the DC/DC converter 60. One terminal of the resistance element 111 and one terminal of the capacitance element 121 are connected to the source of the FET 24, and the opposite terminals of the resistance element 111 and the capacitance element 121 are connected to each other. Further, one terminal of the resistance element 112 and one terminal of the capacitance element 122 are connected at the junction thereof, and the other terminals of the resistance element 112 and the capacitance element 122 are connected to the gate of the FET 24, respectively. Further, the resistance element 19 is connected between the gate and GND of the FET 24, and the smoothing capacitance element 31 is connected between the drain and the GND of the FET 24. The DC voltage V0 is supplied from the source side of the FET 24, and the load 61 such as the IC is connected ahead the smoothing capacitance element 31.

While the change in the gate potential of the FET 24 is described in the third exemplary embodiment, it is not limited only to the FET 24. Any components (elements) having the switch function whose flown current value changes in accordance with the change in the applied voltage can be controlled in the same manner as that of the switch circuit 50 of the third exemplary embodiment. Further, the capacitance elements 121 and 122 configuring the time constant circuit 40 are not limited to be capacitors. Any components having capacitance components can be used for substitutions. The third exemplary embodiment is described by using the capacitors for enabling it with the technique of the lowest const.

Next, actions of the DC/DC converter 60 according to the third exemplary embodiment will be described.

The change in the voltage between the gate and the source of the FET 24 will be described. Immediately after the DC voltage V0 is applied, the capacitance elements 121 ands 122 come to be in a short-circuited state. Thus, the potential applied to the gate of the FET 24 is V0. Assuming here that C1>>C2 (C1 is 10 times as large as C2 in the third exemplary embodiment), charging to the capacitance elements 121,122 is conducted as the time passes. Charging of the capacitance element 122 is completed earlier, so that the capacitance element 122 becomes open state. At this point, charging to the capacitance element 121 is still continued.

The time variation in the gate potential of the FET 24 from the point at which the DC voltage V0 is applied to the source of the FET 24 to the point where charging of the capacitance element 122 is completed and the capacitance element 122 comes in an open state is approximately expressed by Expression 1 described above. Further, charging to the capacitance element 121 at this time is taken into consideration in the value of A in Expression 1.

The change in the gate potential of the FET 24 after charging to the capacitance element 122 is completed and the capacitance element 122 becomes an open state will be described. When the capacitance element 122 is in an open state, it can be considered that there is no capacitance element 122. As a result, the gate potential of the FET 24 comes to change according to the time constant configured with R1, R2, and R3 as shown with Expression 2 described above. Through having such circuit structure, the gate potential of the FET 24 changes steeply until the capacitance element 122 becomes open since the time constant originated in the capacitance 122 becomes dominant, and changes gradually after the capacitance element 122 becomes open since the time constant originated in the capacitance element 121 becomes dominant.

As a way of example, specific numerical values are used to provide an explanation. It is assumed in the circuit structure of the third exemplary embodiment that V0=12 V, R1=1.2 MΩ, R2=300 kΩ, R3=1.5 MΩ, C1=0.1 μF, and C2=0.01 μF. Further, the explanation will be provided by assuming that the FET 24 is a p-channel type MOSFET, and the actual operating voltage is 2.5 V. These values are substituted into Expression 1, and the changing state of the gate potential of the FET 24 is shown in the graphs of FIG. 4 and FIG. 5.

In the case of the circuit structure of the third exemplary embodiment, the time required for the gate potential of the FET 24 to reach the actual operating voltage (potential difference between the gate and the source of the FET 24=2.5 V) is about 10 ms. The changing rate (slope) of the gate potential at this point can be obtained by differentiating Expression 1 with respect to time and substituting "t=10 ms" (or shown with a tangential line of FIG. 5), and it is about −0.038 V/ms. This changing rate of the gate potential influences the rush current when the FET 24 starts up. As the absolute value thereof becomes smaller, the decrease amount of the rush current becomes greater.

Figure 9:
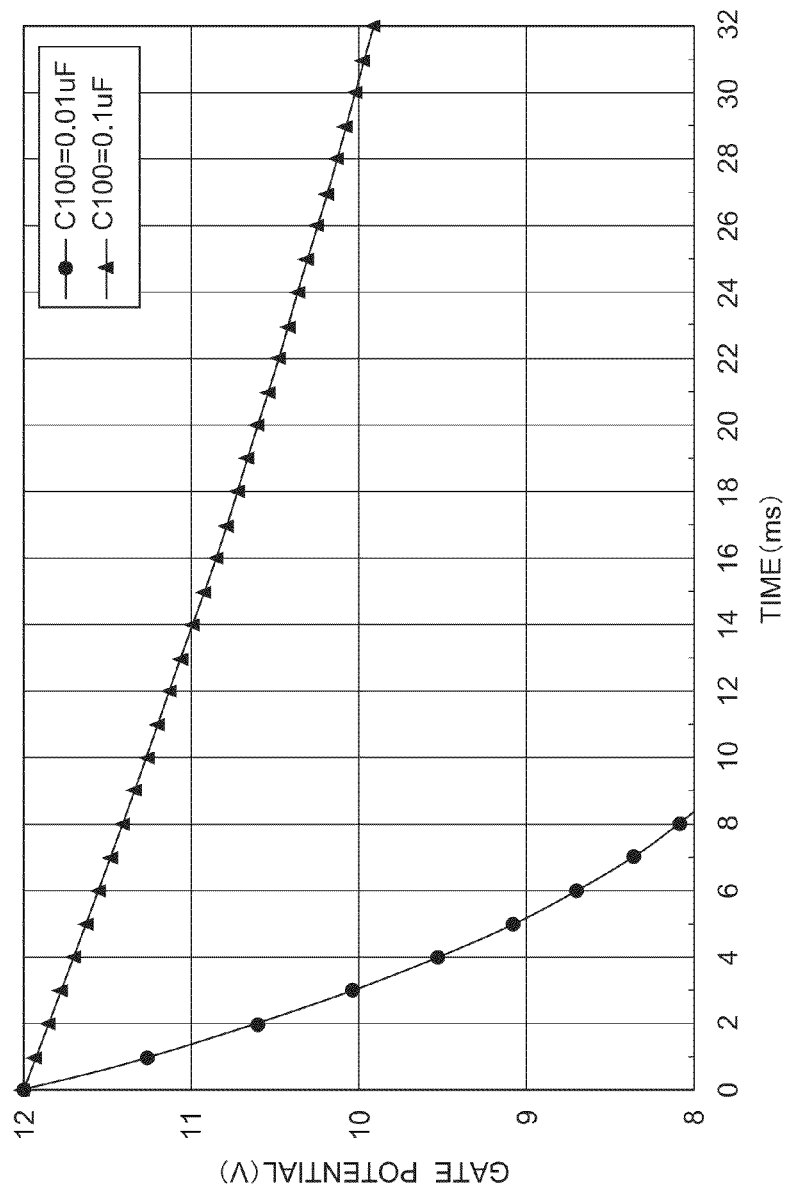
FIG. 9 is a graph showing changes in the gate potential of an FET of the comparative example.

The circuit structure of the comparative example described above is used hereinafter for making comparisons and providing explanations. The comparative example will be described by using FIG. 9 and FIG. 10 in addition to FIG. 8. FIG. 9 is a graph showing the change in the gate potential of the FET of the comparative example. FIG. 10 is a graph showing an example of delay in the starting point of the output voltage of the DC/DC converter of the comparative example. FIG. 10A corresponds to a case where C100=0.01 μF of FIG. 9, and FIG. 10B corresponds to a case where C100=0.1 μF of FIG. 9.

As shown in FIG. 8, the peripheral circuit of the FET 24 according to the comparative example is configured with a resistance element 101, a voltage-dividing resistance element 104, a capacitance element 102, and a smoothing capacitance element 31. The difference with respect to the circuit structure of the third exemplary embodiment is that a time constant circuit 100 disposed between the gate and the source of the FET 24 is configured with the resistance element 101 and the capacitance element 102. That is, the time constant circuit 100 of the comparative example is structured with a single resistance element and a single capacitance element, while the time constant circuit of the third exemplary embodiment is structured with two resistance elements and two capacitance elements.

The time variation in the gate potential of the comparative example is expressed with Expression 3 described above. For making comparisons with the third exemplary embodiment, it is assumed in the circuit structure of the comparative example that V0=12 V, R100=1.5 MΩ, R101=1.5 MΩ, C100=0.01 μF, the FET 24 is a p-channel type MOSFET, and the actual operating voltage is 2.5 V.

The change in the gate potential of the FET 24 obtained by substituting the values above into Expression 3 is shown in the graph of FIG. 9 (a curve of "C 100=0.01 μF"). In this case, the time required to reach the actual operating voltage (potential difference between the gate and the source=2.5 V) of the FET 24 is about 4 ms from FIG. 9. The changing rate (slope)

of the gate potential at this point can be obtained by differentiating Expression 3 with respect to time and substituting "t=4 ms" (may also be calculated from the tangential line of FIG. 9), and it is about −0.47 V/ms. The starting point of the output voltage of the DC/DC converter 120 (FET 24) in a case where "C100=0.01 μF" is shown in FIG. 10A.

This changing rate of the gate potential influences the rush current when the FET 24 starts up. As the absolute value thereof becomes smaller, the decrease amount of the rush current becomes greater. For having the equivalent decrease amount of the rush current in the circuit structure of the comparative example as the case of the third exemplary embodiment, it is necessary to set the time constant thereof as 10 times as large as that of the third embodiment and to satisfy "C100=0.1 μF".

The change in the gate potential of the FET 100 obtained by substituting "C100=0.1 μF" into Expression 3 is shown in the graph of FIG. 9 (a curve of "C100=0.1 μF"). In the case where "C100=0.1 μF" in the comparative example, the time required to reach the actual operating voltage (2.5 V) of the FET 24 is about 40 ms (FIG. 4 and FIG. 5). The changing rate (slope) of the gate potential at this point can be obtained by differentiating Expression 3 with respect to time and substituting "t=40 ms", and it is about −0.047 V/ms. The starting point of the output voltage of the DC/DC converter 120 (FET 24) in a case where "C 100=0.1 μF" is shown in FIG. 10B.

It can be seen that the changing rate of the gate potential at the actual operating voltage point of the FET 24 when it is set as "C100=0.1 μF" in the comparative example takes the same value as the changing rate of the gate potential at the actual operating voltage of the FET 24 according to the third exemplary embodiment. That is, in a case where the FET 24 is turned ON to decrease the rush current in the comparative example and the third exemplary embodiment by a same level, it is possible to shorten the time only to about 10 ms with the third exemplary embodiment, whereas it takes about 40 ms with the comparative example from the point at which the DC voltage is applied.

Further, while the changes in the gate potential at the time where the FET 24 starts up are approximately shown by using Expression 1, Expression 2, and Expression 3 in the third exemplary embodiment and the comparative example, the changes in the gate potential can be calculated easily by using a circuit simulator such as Spice (Simulation Program with Integrated Circuit Emphasis), for example.

For example, the actual operating voltage of the FET is explained as being 2.5 V in the third exemplary embodiment. However, the value of the actual operating voltage may vary depending on the FET in some cases. In such case, the optimum resistance value and the capacitance value of the time constant circuit 40 can be selected by checking the actual operating voltage of the FET 24 and the changing rate of the gate potential through conducting a simulation on the time constant of the time constant circuit 40 that is loaded between the gate and the source of the FET by using a circuit simulator. The important thing is to select the resistance values R1, R2, R3 and the capacitance values C1, C2 so that the charging completion point of the capacitance element 122 comes in the vicinity of the actual operating voltage of the FET 24.

Figure 11:
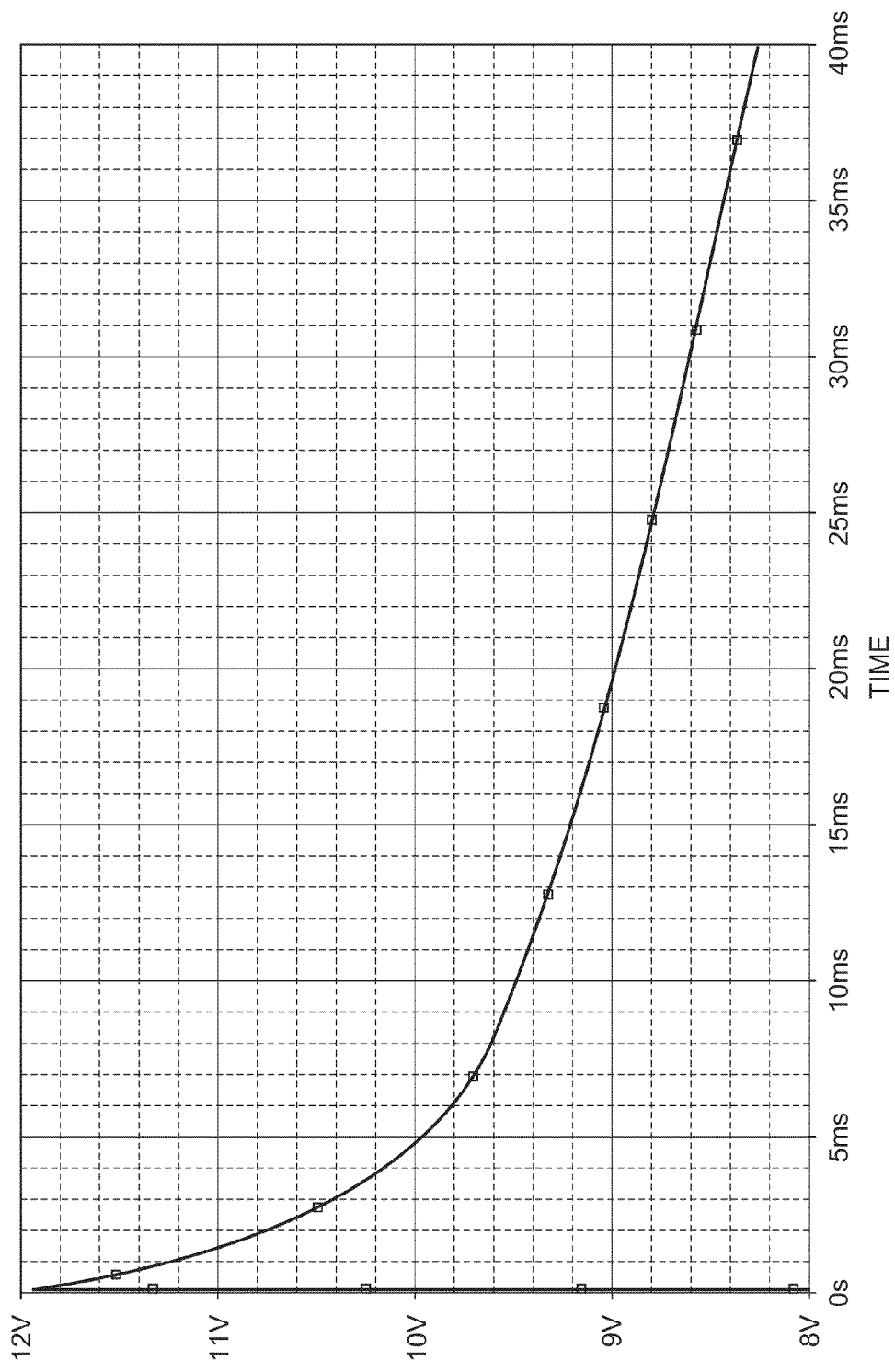
FIG. 11 is a graph showing a simulation result of the gate potential of the FET according to the third exemplary embodiment.
Figure 12:
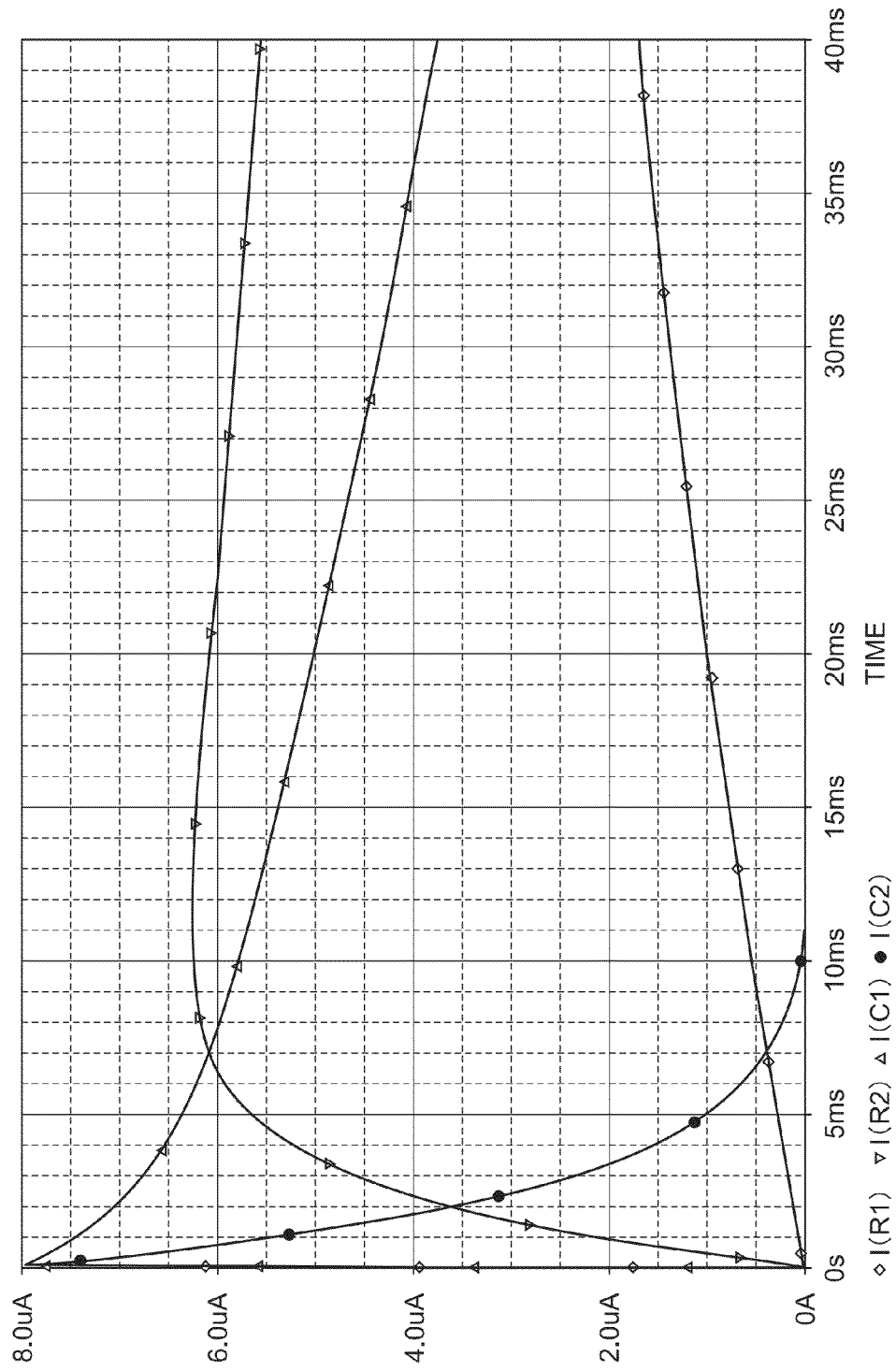
FIG. 12 is a graph showing a simulation result of the electric currents flowing in the resistance element and the capacitance element according to the third exemplary embodiment.

For a reference, the simulation result regarding the structure of the third exemplary embodiment is shown in FIG. 11 and FIG. 12. FIG. 11 is a graph showing the simulation result conducted regarding the gate potential of the FET 24 of the third exemplary embodiment, and it corresponds to the gate potential (thick solid line) of the FET 24 extracted from FIG. 4. FIG. 12 is a graph showing the simulation result regarding the electric current flown in the resistance elements 111, 112 and the capacitance element 121, 122 of the third exemplary embodiment. In FIG. 12, the lateral axis (ms) is the time, the longitudinal axis is the electric current (μA), the electric currents flown in the resistance elements 111, 112 are ◇: I(R1), ▽: I(R2), and the electric currents flown in the capacitance elements 121, 122 are Δ: I(C1), ●: I(C2). As can be seen from FIG. 12, I(C2)≦0 at about 10 ms. This means that charging of the capacitance element 122 is completed.

As described above, when the rush current amount at the time of starting up the FET is made to be the same level in the comparative example and the third exemplary embodiment, i.e., when the time variation in the gate potential at the time of starting up the FET is made to be the same level in the comparative example and the third exemplary embodiment, followings can be said. The time required until the FET starts up is delayed in proportional to the time constant of the time constant circuit with the comparative example, while the amount of delay until the FET starts up can be shortened as much as possible with the third exemplary embodiment compared to the comparative example. In other words, through employing the circuit structure of the third exemplary embodiment to a display device, the time until the display device starts up can be shortened as much as possible while decreasing the rush current generated at the time of starting up the display device.

Next, effects of the third exemplary embodiment will be described in more details.

In the comparative example shown in FIG. 8, the time constant circuit 100 used between the gate and the source of the FET 24 is formed with a single resistance element 101 and a single capacitance element 102, and the gate potential of the FET is raised gradually to decrease the rush current generated at the time of starting up the FET 24 (at the time of starting up the DC/DC converter 120). However, when the time constant is to be increased in the time constant circuit 100 of the comparative example, the time until the starting point of the FET 24 (starting point of the DC/DC converter 120) becomes delayed.

In the meantime, the third exemplary embodiment shown in FIG. 3, the time constant circuit 40 used between the gate and the source of the FET 24 is formed with the two resistance elements 111, 112 and the two capacitance elements 121, 122. Thereby, the delay time until the starting point of the FET 24 (starting point of the DC/DC converter 60) can be shortened compared to the case of the comparative example while decreasing the rush current at the time of starting up the FET 24.

Specifically, if the time constant is set to be 10 times as large with the simple time constant circuit 100 as that of the comparative example when decreasing the rush current at the time of starting up the FET 24, the starting point of the FET is also delayed by 10 times. In the meantime, the delay amount of the starting point of the FET 24 can be suppressed to about 2.5 times by employing the time constant circuit 40 of the third exemplary embodiment.

FIG. 4 shows the changes in the gate potentials of the FET 24 according the comparative example and the third exemplary embodiment. In FIG. 4, the gate potential of the FET 24 corresponding to the actual operating voltage 2.5 V of the FET 24 (the potential difference between the gate and the source of the FET 24 is 2.5 V) is 9.5 V. In FIG. 4, the time that reaches the line of 9.5 V is 10 ms with the third exemplary embodiment (thick solid line in FIG. 4), while it is 40 ms with the comparative example (▲ in FIG. 4).

That is, by employing the circuit structure of the third exemplary embodiment to a display device, the time until the display device is started up can be shortened as much as possible while decreasing the rush current generated at the time of starting up the display device. Further, the circuit structure of the third exemplary embodiment can be achieved simply at a low cost through using a time constant circuit formed only with a passive element. Moreover, the circuit structure of the third exemplary embodiment makes it possible to shorten the delay amount of the starting time, while decreasing the rush current at the time of starting up the FET (at the time of starting up the DC/DC converter).

Fourth Exemplary Embodiment

Figure 6:
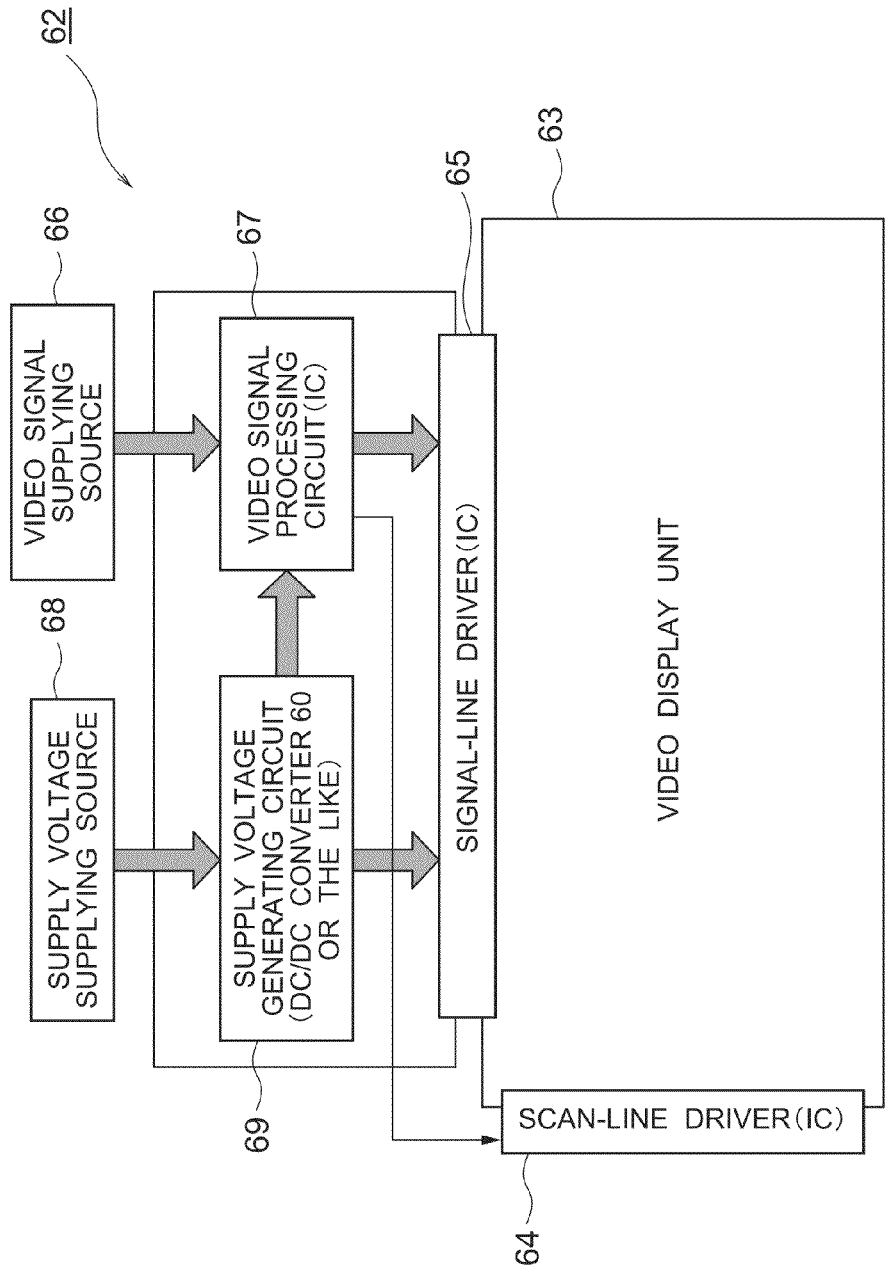
FIG. 6 is a block diagram showing a fourth exemplary embodiment.

FIG. 6 is a block diagram showing a fourth exemplary embodiment of the present invention. Hereinafter, explanations will be provided by referring to FIG. 6.

A display device 62 of the fourth exemplary embodiment is characterized to include: a video display unit 63 having pixels at each of intersection points of matrix of signal lines and scan lines; a scan-line driver 64 and a signal-line driver 65 which apply voltages according to a video signal to each pixel of the video display unit 63; a video signal processing circuit 67 which processes the video signal acquired from a video signal source 66, and outputs it to the scan-line driver 64 and the signal-line driver 65; and a supply voltage generating circuit 69 which converts the voltage acquired from a supply voltage supplying source 68 into a prescribed value, and supplies it to the scan-line driver 64, the signal-line driver 65, and the video signal processing circuit 67. The display device 62 is characterized to include the DC/DC converted 60 of the third exemplary embodiment inside the supply voltage generating circuit 69. For example, the video display unit 63 is a liquid crystal panel, and the display device 62 is a liquid crystal display device.

In order to drive the video display unit 63, the video signal processing circuit 67 and the supply voltage generating circuit 69 are required. The video signal processing circuit 67 processes the video signal supplied from the video signal supplying source 66 (rearranging the video signals, generating a reference signal, and the like). The supply voltage generating circuit 69 supplies proper supply voltages to various ICs (the scan-line driver 64, the signal-line driver 65, the video signal processing circuit 67, and the like) for driving the video display unit 63.

The supply voltage generating circuit 69 generates a plurality of supply voltages from one kind of supplied supply voltage. There are a plurality of ICs such as the scan-line driver 64, the signal-line driver 65, and the video signal processing circuit 67 for driving the video display unit 63, and the supply voltages required by each of the ICs are different in many cases. In such case, it is necessary to have a circuit (DC/DC converter 60 or the like) which generates a plurality of supply voltages from a single supplied supply voltage. As described above, a switch FET for controlling the starting order and the starting timing of each power source is used for the DC/DC converter 60.

In the display device 62, the supply voltage generating circuit 69 that includes the DC/DC converter 60 is used. Therefore, there is no malfunctioning generated due to the rush current at the time of supplying the power, and the time required from the point at which the power is supplied to the point at which a video is displayed becomes short.

While the DC/DC converter 60 of the third exemplary embodiment is used in the fourth exemplary embodiment, it is also possible to use the DC/DC converter of other embodiments. The display device 62 is not limited only to a liquid crystal display device. For example, any types of display devices such as an organic EL display device and an LED display device may be used.

Fifth Exemplary Embodiment

Figure 7:
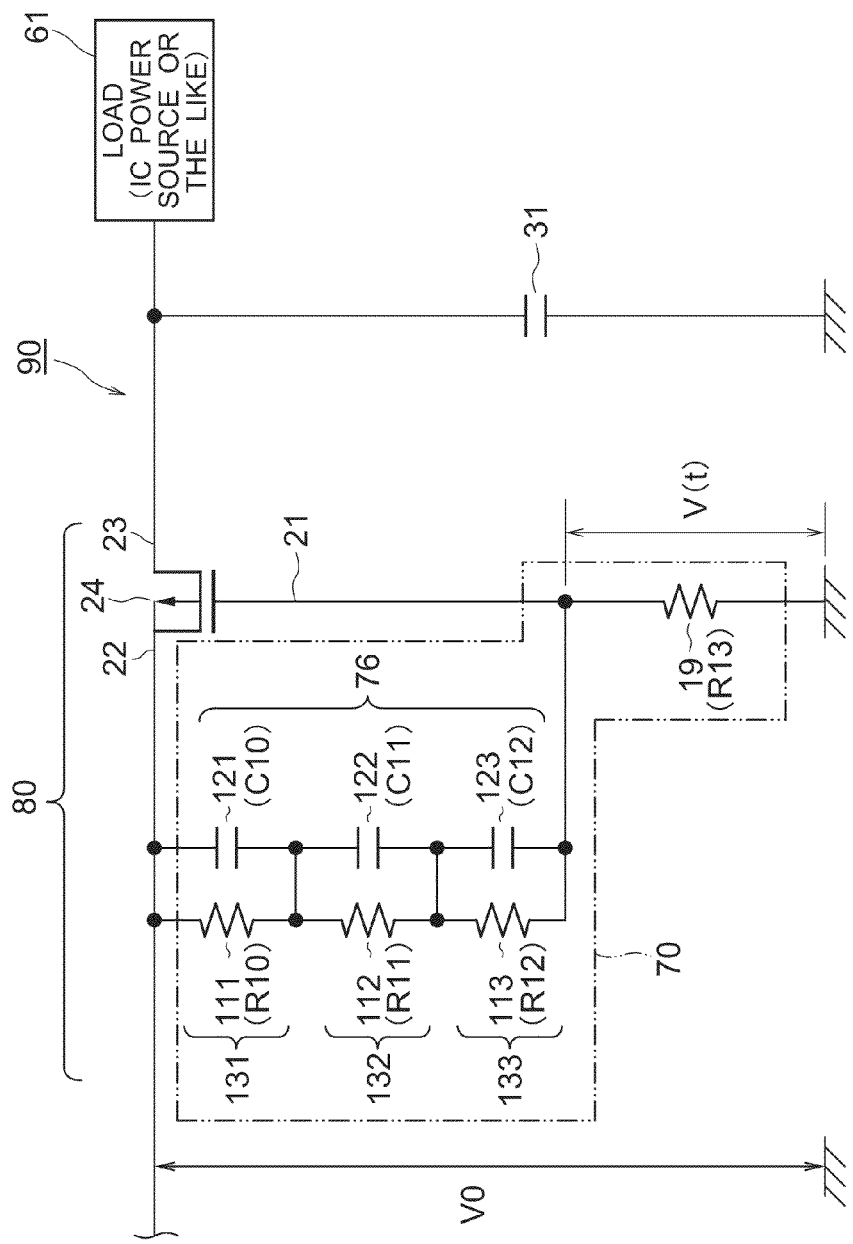
FIG. 7 is a circuit diagram showing a fifth exemplary embodiment.

FIG. 7 is a circuit diagram showing a fifth exemplary embodiment of the present invention. Explanations will be provided hereinafter by referring to FIG. 7. Same reference numerals as those of FIG. 3 are applied to the same structural elements in FIG. 7 as those of FIG. 3.

In the fifth exemplary embodiment, a serial-parallel circuit 76 is formed with a first parallel circuit 131, a second parallel circuit 132, and a third parallel circuit 133. The first parallel circuit 131 is formed with a resistance element 111 (resistance value R10) and a capacitance element 121 (capacitance value C10), the second parallel circuit 132 is formed with a resistance element 112 (resistance value R11) and a capacitance element 122 (capacitance value C11), and the third parallel circuit 133 is formed with a resistance element 113 (resistance value R12) and a capacitance element 123 (capacitance value C 12). A time constant circuit 70 is formed with the serial-parallel circuit 76 and a voltage-dividing resistance element 19 (resistance value R13). A switch circuit 80 includes the time constant circuit 70 and an FET 24. A DC/DC converter 90 includes the switch circuit 80 and a smoothing capacitance element 31.

The time constant circuit 70 of the fifth exemplary embodiment uses three resistance elements and three capacitance elements, while the time constant circuit of the third exemplary embodiment uses two resistance elements and two capacitance elements. Other structures of the fifth exemplary embodiment are the same as those of the third exemplary embodiment. It is possible with the fifth exemplary embodiment to make the change in the gate potential until reaching the actual operating voltage of the FET 24 steeper. That is, it is possible to shorten the delay amount of the starting point of the FET 24 than the case of the third exemplary embodiment.

This is because the change in the gate potential of the FET 24 until reaching the actual operating voltage of the FET 24 can be controlled more delicately by forming the time constant circuit 70 between the gate and the source of the FET 24 with the three capacitance elements 121 to 123. Similarly, it is possible to perform more delicate controls through forming the time constant circuit by using N-pieces of capacitance elements and N-pieces of resistance elements and by connecting that time constant circuit between the gate and the source of the FET (first exemplary embodiment). The change in the gate potential of the FET when three or more capacitance elements are used between the gate and the source of the FET can be shown according to Expressions 1 and 2 described above. It can also be easily known by using a circuit simulator. Differences with respect to the third exemplary embodiment regarding operations of the fifth exemplary embodiment are as follows. That is, in the fifth exemplary embodiment, the time constant circuit 70 that uses three capacitance elements 121-123 is provided between the gate and the source of the FET 24. Thus, the part where the gate potential of the FET 24 changes steeply depending on the passage of time described in the third exemplary embodiment (change in the gate potential until reaching the actual operating voltage of the FET 24) can be changed more steeply. In other words, by making the gate potential of the FET 24 close to the time until the FET 24 starts up (time until the actual operating voltage of the FET 24) more steeply, the delay amount until the FET 24 starts up can be shortened further. Thus, it is possible with the fifth exemplary embodiment to shorten the starting delay amount of the FET 24 compared to the case of the third exemplary embodiment.

Effects of the fifth exemplary embodiment are that the rush current at the time of starting up the display device can be decreased, and that the time until starting up the display device can be shortened as much as possible as in the case of the third exemplary embodiment. The difference with respect to the third exemplary embodiment regarding the effects of the fifth exemplary embodiment is that the time until starting up the display device can be shortened further compared to the case of the third exemplary embodiment by using three capacitance elements for the time constant circuit. Therefore, the fifth exemplary embodiment makes it possible to provide a simple and low-cost circuit structure by using the time constant circuit formed only with a passive element and to shorten the delay amount in the starting time than the case of the third exemplary embodiment while decreasing the rush current at the time of starting up the FET (at the time of starting up the DC/DC converter).

Other effects, operations, and effects of the fifth exemplary embodiment are the same as those of the first, second, and third exemplary embodiments.

(Others)

Next, the present invention described above as the first to fifth exemplary embodiments will be summarized as a whole.

An exemplary object of the present invention is to provide, as a technique for overcoming the above-described issues, a display device and the like having a circuit with which the rush current generated at the time of starting up the DC/DC converter is decreased, the delay time of the starting time of the DC/DC converter is shortened as much as possible, and the scale thereof is minimized.

In order to achieve the exemplary object, the circuit structure in which the FET is turned ON by using the time constant circuit structured with the resistance element and the capacitance element is employed for controlling the gate potential of the FET. However, with the time constant circuit that simply uses one each of the resistance element and capacitance element, the delay amount of the starting point is determined almost in proportional to the time constant. Thus, the present invention employs a following circuit structure.

In the present invention, the time constant circuit between the gate and the source of the FET is structured by combining two capacitance elements and two resistance elements. One capacitance element and one resistance element are connected in parallel, two pairs thereof are connected in series, and the both ends thereof are connected to the gate and the source of the FET, respectively. With this structure, the change in the gate potential of the FET can be expressed with $V1(t)$ and $V2(t)$ which are depicted in the third exemplary embodiment and the like.

Subsequently, a means for solving the problems will be described. As for the control of the gate potential of the FET, there may be a case that employs a circuit structure in which the resistance element and the capacitance element are disposed between the gate and the source of the FET, and the FET is turned ON by using the time constant thereof. In that case, with the time constant circuit formed by using one resistance element and one capacitance element between the gate and the source of the FET, the delay amount of the starting point is determined almost in proportional to the time constant. It is necessary to have a large value of the time constant in order to decrease the rush current at the time of starting up the FET. In the meantime, it is necessary to have a small value of the time constant in order to shorten the delay amount of the starting point of the FET as much as possible.

Therefore, the present invention employs the structure in which the time constant circuit provided between the gate and the source of the FET is formed by adding one more capacitance element and one more resistance element and combining those. The feature of the time constant circuit is that the change amount of the gate potential of the FET becomes steep immediately after the voltage is applied to the FET (start to generate potential difference between the gate and the source of the FET) while the change amount of the gate potential of the FET becomes gradual in the vicinity of the voltage (actual operating voltage) at which the FET turns ON.

Subsequently, the effects of the present invention will be described. It is the feature of the time constant circuit of the present invention to control the change amount of the gate potential of the FET to be steep immediately after the potential difference between the gate and the source of the FET is generated and to control the change amount of the gate potential of the FET to be gradual in the vicinity of the voltage (actual operating voltage) at which the FET turns ON. With a typical time constant circuit (the circuit formed with one resistance element and one capacitance element), the voltage changes with the time constant determined by one resistance element and one capacitance element until it reaches the voltage (actual operating voltage) at which the FET is actually turned on. Thus, the time for reaching the actual operating voltage of the FET becomes extended for the increased value of the time constant. In the meantime, the time for reaching the actual operating voltage of the FET can be shortened as much as possible through employing the structure of the time constant circuit of the present invention. That is, it is possible to provide a display device capable of decreasing the rush current amount and shortening the delay amount of the DC/DC converter as much as possible, which can be formed in the minimum circuit scale. This makes it possible to decrease the rush current generated at the time of starting up the display device, while suppressing the delay time for displaying a video on the display device as much as possible.

While the present invention has been described above by referring to each of the above exemplary embodiments, the present invention is not limited to each of those exemplary embodiments. Various changes and modifications that occur to those skilled in the art can be applied to the structures and details of the present invention. It is to be noted that those acquired by mutually combining a part of or the entire part of the structures of each of the above-described exemplary embodiments as appropriate are included as the present invention. Particularly, the structural elements shown in FIG. 1-FIG. 3 and in FIG. 7 are not necessarily corresponded to the components. That is, structures that can be expressed as in FIG. 1-FIG. 3 and FIG. 7 with equivalent circuits are also included as the present invention.

The present invention can also be expressed as follows.

(1) A DC/DC converter that includes a supply voltage generating circuit having a time constant circuit that is formed by connecting at least two capacitors connected in series between a gate and a source of an FET.

(2) The DC/DC converter depicted in (1) which includes the supply voltage generating circuit having the time constant circuit, in which: one terminal of a first capacitor and one terminal of a first resistor are connected to the source side of the FET; the other terminal of the first capacitor and the other terminal of the first resistor are connected to one terminal of a second capacitor and one terminal of a second resistor; the other terminal of the second capacitor and the other terminal of the second resistor are connected to the gate side of the FET; and a third resistor is connected between the gate side and the GND of the FET.

(3) The DC/DC converter depicted in (1) or (2) having a time constant circuit, between the gate and the source of the FET, which is so structured that a slope of the gate potential changes steeply until reaching the actual operating voltage at which the FET comes to be in an ON state by applying the voltage between the gate and the source of the FET and that a slope of the gate potential at an instant at which the voltage reaches the actual operating voltage changes gradually than the slope of the gate potential observed until reaching the actual operating voltage.

(4) A display device to which the DC/DC converter depicted in any of (1)-(3) described above is loaded.

INDUSTRIAL APPLICABILITY

The present invention can be utilized for a time constant circuit which outputs a voltage that attenuates as the time passes, and for a switch circuit, a DC/DC converter, a display device, and the like, which are provided with the same.

What is claimed is:

1. A switch circuit, comprising:
a time constant circuit comprising:
   a serial-parallel circuit that is formed by serially connecting a plurality of parallel circuits each structured with a resistance element and a capacitance element between a first terminal and a second terminal; and
   a voltage-dividing resistance element connected between a third terminal that is connected to the second terminal and a fourth terminal,
   wherein the first terminal and the second terminal are input terminals, and the third terminal and the fourth terminal are output terminals;
   wherein when a DC (direct current) voltage is applied between the input terminals, an output voltage acquired between the output terminals changes according to a sum of a plurality of exponential functions of a different time constants; and
wherein:
   the serial-parallel circuit is formed with a first parallel circuit and a second parallel circuit;
   a first exponential function and a second exponential function are derived approximately from the sum of the plurality of exponential functions; and
   the output voltage changes according to the first exponential function from a point immediately after the DC current is applied until a specific time, and changes according to the second exponential function after the specific time;
a control terminal, and
a semiconductor switch element having a first conductive terminal and a second conductive terminal, wherein:
   when a specific voltage is applied to the control terminal, between the first conductive terminal and the second conductive terminal of the semiconductor switch element becomes conductive;
   the first terminal is connected to the first conductive terminal, and the third terminal is connected to the control terminal; and
   the output voltage reaches the specific voltage after the specific time.

2. The switch circuit as claimed in claim 1, wherein:
the semiconductor switch element is a p-channel type FET, the first conductive terminal and the second conductive terminals are a source terminal and a drain terminal, respectively, and the control terminal is a gate terminal; and
the specific voltage is a threshold voltage of the FET.

3. A DC/DC converter, comprising:
the switch circuit of claim 2; and
a smoothing capacitance element connected between the drain terminal of the FET and the fourth terminal.

4. A display device, comprising the DC/DC converter of claim 3.

5. A time constant circuit, comprising:
a serial-parallel circuit that is formed by serially connecting a plurality of parallel circuits each structured with a resistance element and a capacitance element between a first terminal and a second terminal; and
a voltage-dividing resistance element connected between a third terminal that is connected to the second terminal and a fourth terminal,
wherein the first terminal and the second terminal are input terminals, and the third terminal and the fourth terminal are output terminals,
wherein when a DC (direct current) voltage is applied between the input terminals, an output voltage acquired between the output terminals changes according to a sum of a plurality of exponential functions of different time constants, and
wherein:
   the serial-parallel circuit is formed with a first parallel circuit and a second parallel circuit; and
   $R1>R2$ and $C1>C2$ apply, provided that a resistance value of the resistance element of the first parallel circuit is R1, a capacitance value of the capacitance element of the first parallel circuit is C1, a resistance value of the resistance element of the second parallel circuit is R2, a capacitance value of the capacitance element of the second parallel circuit is C2.

6. The time constant circuit as claimed in claim 5, wherein $R3 \times C1 > 100$ (k$\Omega \cdot \mu$F) applies, provided that a resistance value of the voltage-dividing resistance element is R3.

* * * * *